United States Patent
Leyrer et al.

(10) Patent No.: US 11,290,099 B2
(45) Date of Patent: Mar. 29, 2022

(54) MANAGING PULSE-WIDTH MODULATION TRIP SIGNALS FROM MULTIPLE SOURCES

(71) Applicant: TEXAS INSTRUMENTS INCORPORATED, Dallas, TX (US)

(72) Inventors: Thomas Anton Leyrer, Geisenhausen (DE); Martin Staebler, Freising (DE); William Cronin Wallace, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/066,660

(22) Filed: Oct. 9, 2020

(65) Prior Publication Data
US 2021/0028777 A1  Jan. 28, 2021

Related U.S. Application Data

(63) Continuation of application No. 16/424,862, filed on May 29, 2019, now Pat. No. 10,812,060.

(60) Provisional application No. 62/677,878, filed on May 30, 2018, provisional application No. 62/786,477, filed on Dec. 30, 2018.

(51) Int. Cl.
| G06F 11/07 | (2006.01) |
| H03K 7/08 | (2006.01) |
| H02P 3/18 | (2006.01) |
| H03K 19/00 | (2006.01) |

(52) U.S. Cl.
CPC ............ *H03K 7/08* (2013.01); *G06F 11/0751* (2013.01); *G06F 11/0754* (2013.01); *H02P 3/18* (2013.01); *H03K 19/0016* (2013.01)

(58) Field of Classification Search
CPC ... G06F 11/0751; G06F 11/0754; H03K 7/08; H03K 19/0016; H02P 3/00; H02P 3/02; H02P 3/06; H02P 3/08; H02P 3/18
USPC .......................................................... 332/109
See application file for complete search history.

(56) References Cited

U.S. PATENT DOCUMENTS

| 5,538,423 A | 7/1996 | Cross et al. |
| 5,615,098 A | 3/1997 | Ishii et al. |
| 5,675,297 A | 10/1997 | Gose et al. |
| 6,163,119 A | 12/2000 | Jeong |
| 2006/0097685 A1 | 5/2006 | Shin et al. |
| 2010/0156493 A1 | 6/2010 | Yedevelly et al. |
| 2012/0110374 A1* | 5/2012 | Brewerton .......... G06F 11/3068 714/5.11 |
| 2013/0335045 A1 | 12/2013 | Zhang et al. |
| 2014/0325288 A1* | 10/2014 | Koenigseder ....... G06F 11/0754 714/47.2 |

(Continued)

*Primary Examiner* — Levi Gannon
(74) *Attorney, Agent, or Firm* — Brian D. Graham; Charles A. Brill; Frank D. Cimino

(57) ABSTRACT

An integrated communications subsystem (ICSS) includes a pulse-width modulator which drives a power stage, such as a motor. The pulse-width modulator is configured shut off the power stage when the pulse-width modulator receives a trip signal from a logic circuit of the ICSS. The logic circuit can easily be reprogrammed to send a trip signal only when certain error conditions are detected. Moreover, the ICSS contains one or more filters which can adjust the sensitivity of the logic circuit to error signals, enabling the ICSS to distinguish between true errors which require shutdown and glitches, which can be ignored during operation of the ICSS.

20 Claims, 9 Drawing Sheets

(56) References Cited

U.S. PATENT DOCUMENTS

| | | |
|---|---|---|
| 2016/0141865 A1* | 5/2016 | Drake .................. H02H 7/0822 318/445 |
| 2016/0147584 A1 | 5/2016 | Lim |
| 2017/0085210 A1 | 3/2017 | Tsai |
| 2019/0260300 A1 | 8/2019 | Horikoshi et al. |

* cited by examiner

- ONE trip_out_x PER AXIS. TOTAL 3 AXIS. (3x THE LOGIC ABOVE)
- MASKED OR GATES OF 8 TRIP EVENTS
- trip_out CAN BE ONE SHOT (MANUAL RESET) OR CYCLE BY CYCLE (CMP0 - PERIOD RESET)
- FOR SINGLE ENDED PWM ONE trip_out GOES TO 3 PWMx
  FOR COMPLEMENTARY PWM ONE trip_out_x GOES TO 6 PWMx
  trip_e3 (SD SHORT CIRCUIT) COMES FROM NEW COMPARE ON SD STAGE 1
  trip_e4/e5 ARE PRU PROGRAMMED EVENTS

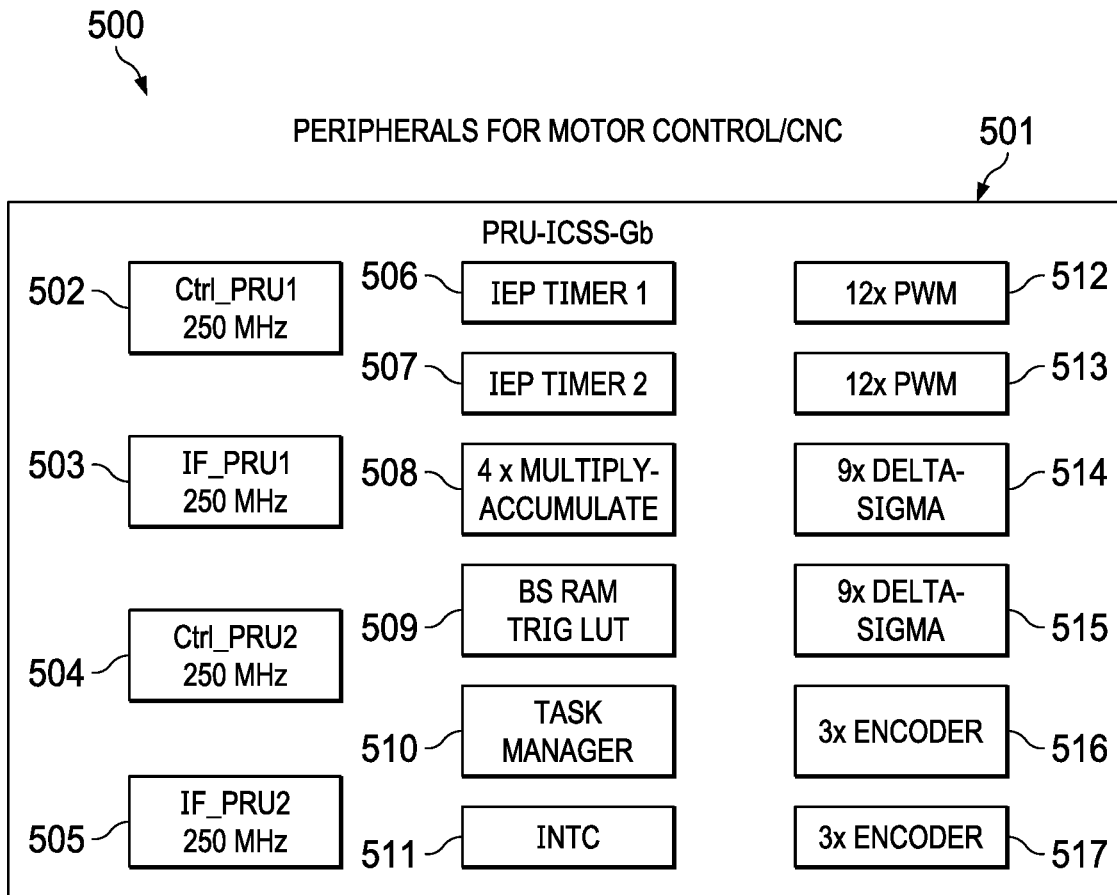

REAL-TIME COMPUTE
• PRU-ICSS-Gb: QUAD PRU - 4 x 250 MHz

MULTI-AXIS MOTOR CONTROL INTERFACE
• 24 x PWMs WITH ENHANCED TRIP CONTROL STATE MACHINE
• 18 x DELTA-SIGMA FILTERS WITH SHORT CIRCUIT AND OVER-CURRENT LOGIC
• 6 x MULTI-PROTOCOL POSITION ENCODER INTERFACES
• TIME SYNCHRONIZATION OF PWM, DS AND ENCODER INTERFACES
• 2 x TUNABLE TIME SYNC DOMAINS WITH 1 ns RESOLUTION AND EXTERNAL SYNC/LATCH
• REAL-TIME TASK MANAGER USING DRIVE SYNC EVENTS

INDUSTRIAL COMMUNICATION SUBSYSTEM
• MULTI-PROTOCOL INDUSTRIAL ETHERNET (1 Gbit)
• 1 Gbit: TSN, PROFINET@ TSN
• 100 Mbit: PROFINET/IRT, EtherCAT, SERCOS 3, ETHERNET/IP, POWERLINK, OTHERS
• EXTERNAL 2x LATCH/2x SYNC SIGNALS PER IEP TIMER

FIG. 5

MANAGING PULSE-WIDTH MODULATION TRIP SIGNALS FROM MULTIPLE SOURCES

CROSS-REFERENCE TO RELATED APPLICATIONS

This application is a continuation of U.S. patent application Ser. No. 16/424,862, filed May 29, 2019, which claims priority to U.S. Provisional Application No. 62/677,878, filed May 30, 2018, and U.S. Provisional Application No. 62/786,477, filed Dec. 30, 2018, each of which is incorporated by reference in its entirety.

TECHNICAL FIELD

The present disclosure relates generally to an industrial communication sub-system (ICSS) that can be formed as part of an integrated circuit, such as a digital signal processor (DSP), a system on a chip (SoC), or an application specific integrated circuit (ASIC), or a field programmable gate array (FPGA). More specifically, the present disclosure relates to systems and methods for managing pulse-width modulation trip signals from multiple sources in an industrial control sub-system.

BACKGROUND

Industrial motor control application such as robotics, servo drives and computer numeric controls require the ability to turn off powered devices when error conditions arise which could cause damage to motors, machines and/or people.

SUMMARY

At least one example of this disclosure includes a control system, comprising: a power stage; pulse-width modulator coupled to the power stage, the pulse-width modulator configured shut off the power stage when the pulse-width modulator receives a trip signal; a processor coupled to the pulse-width modulator; a logic circuit coupled to the pulse-width modulator and the processor, the logic circuit comprising: a first interface comprising a plurality of inputs, wherein the plurality of inputs comprises: a first input configured to receive a first trip event indication signal originating at the pulse-width modulator; a second input configurable to receive a second trip event indication signal originating at an electronic device releasably coupled to the second input at a connection port; and a third input configured to receive a third trip event indication signal from the processor; and a second interface comprising: a first selection-input configured to receive a first selection; and a second selection-input configured to receive a second selection, wherein the logic circuit is configured to send the trip signal to the pulse-width modulator when the logic circuit receives at least one of the three trip event indication signals.

At least one other example of this disclosure includes a logic circuit coupled to a pulse-width modulator, the logic circuit configured to receive a plurality of inputs, the plurality of inputs comprising: a first input corresponding to a first signal originating at the pulse-width modulator; a second input corresponding to a second signal originating at an electronic device; and a third input corresponding to a third signal originating at one or more processors; wherein the logic circuit is configured to controllably select which of the plurality of inputs to output to pulse-width modulator as a trip signal to cause the pulse-width modulator to shut down a power stage driven by the pulse-width modulator.

At least one additional example of this disclosure is a method for managing trip signals for a pulse-width modulator, the method comprising: driving, using a pulse-width modulator, a power stage; receiving, at a logic circuit, a first input corresponding to a first trip event indication signal originating at the pulse-width modulator; receiving, at the logic circuit, a second input corresponding a second trip event indication signal originating at an electronic device releasably coupled to the logic circuit at a port; receiving a third input corresponding to a third trip event indication signal from a processor; selecting, by the logic circuit, which input to output to the pulse-width modulator as a trip signal to cause the pulse-width modulator to shut down a power stage driven by the pulse-width modulator, wherein selecting comprises selecting from a plurality of inputs comprising the first input, the second input, and the third input; and outputting, from the logic circuit, the selected input.

BRIEF DESCRIPTION OF THE DRAWINGS

For a detailed description of various examples, reference will now be made to the accompanying drawings, in which:

FIG. 5 illustrates aspects of a system such as those illustrated in FIG. 1 and FIGS. 2A-C, in accordance with an example of this disclosure;

DETAILED DESCRIPTION

Figure 1:
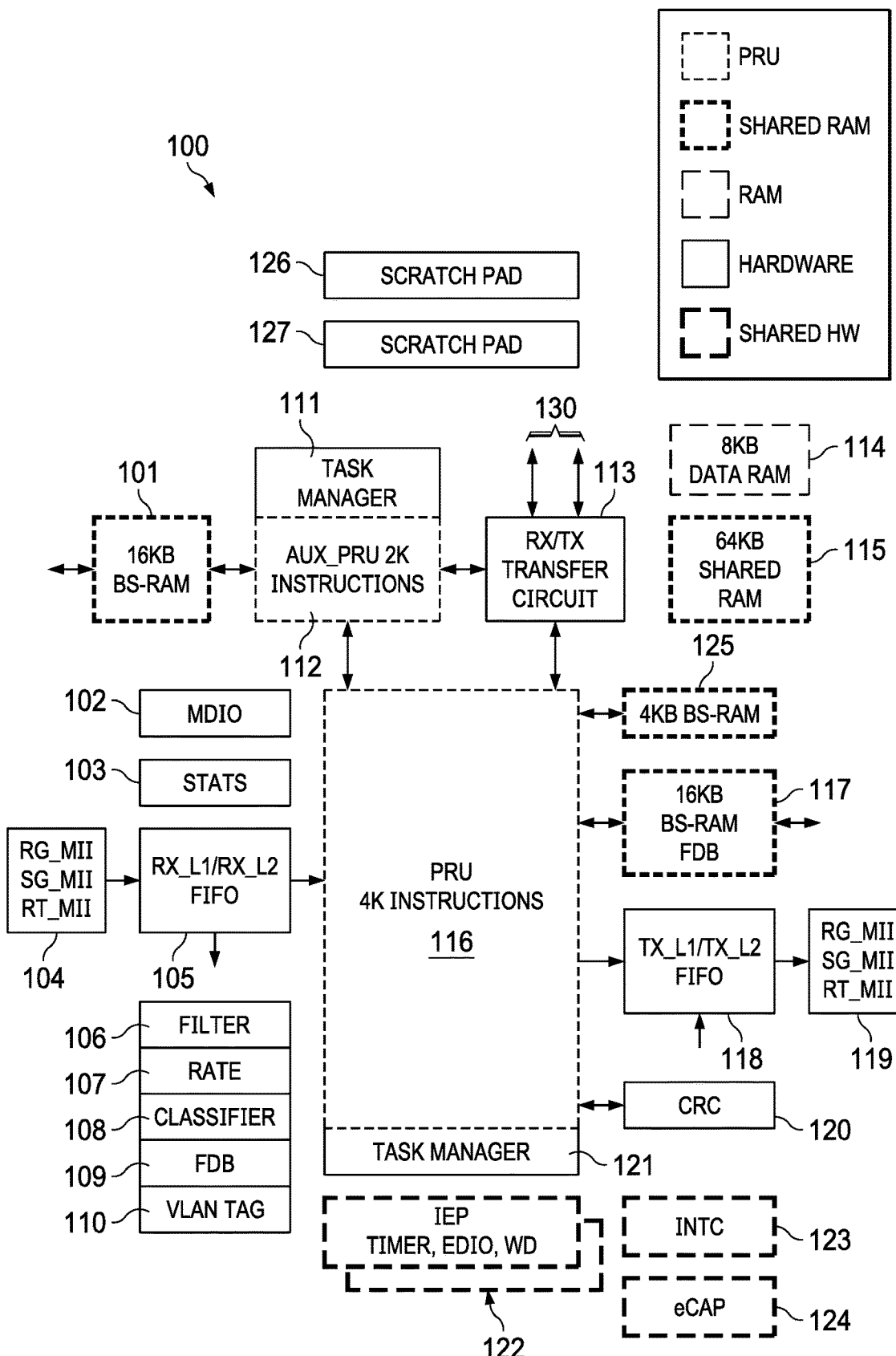
FIG. 1 is a block diagram of a system having an architecture in accordance with an example of this disclosure.

In the following description, for purposes of explanation, numerous specific details are set forth in order to provide a thorough understanding of the examples disclosed herein. In other instances, structure and devices are shown in block diagram form to avoid obscuring the disclosed examples.

When introducing elements of various examples of the present disclosure, the articles "a," "an," and "the" are intended to mean that there are one or more of the elements. The terms "comprising," "including," and "having" are intended to be inclusive and mean that there might be additional elements other than the listed elements. The examples discussed below are intended to be illustrative in nature and should not be construed to mean that the examples described herein are necessarily preferential in nature.

The examples described in this disclosure are neither mutually exclusive nor collectively exhaustive. References to "one example" or "an example" are not to be interpreted as excluding the existence of additional examples that also incorporate the recited features.

When used herein, the term "medium" refers to one or more non-transitory physical media that together store the contents described as being stored thereon. The term "medium" does not include a signal, electrical or otherwise. Examples may include non-volatile secondary storage, read-only memory (ROM), and/or random-access memory (RAM).

When used herein, the terms "application" and "function" refer to one or more computing modules, programs, processes, workloads, threads and/or a set of computing instructions executed by a computing system. Example implementations of applications and functions include software modules, software objects, software instances and/or other types of executable code.

One or more examples of this disclosure are implemented on a 'system on chip' (SoC). In at least one example, an SoC comprises multiple hardware components. In at least one example, an SoC comprises a microcontroller, a microprocessor, a digital signal processor (DSP) core, and/or a multiprocessor SoC having more than one processor core. In at least one example, an SoC comprises memory blocks including a selection of ROM, RAM, electrically erasable programmable read-only memory, and flash memory. In at least one example, an SoC comprises timing sources including oscillators and phase-locked loops. In at least one example, an SoC comprises peripherals including counter-timers, real-time timers and power-on reset generators. In at least one example, an SoC comprises analog interfaces including analog-to-digital converters and digital-to-analog converters. In at least one example, an SoC comprises voltage regulators and power management circuits.

In at least one example, an SoC includes both the hardware described above and the software and/or firmware controlling the microcontroller, microprocessor or DSP cores, peripherals and interfaces.

Within this discloser, pulse-width modulation refers to the process of modifying the width of pulses in a pulse train in direct proportion to a small control signal; the greater the control voltage, the wider the resulting pulses become. By using a sinusoid of the desired frequency as the control voltage for a pulse-width modulation control circuit (also known as 'pulse-width modulator'), it is possible to produce a high-power waveform whose average voltage varies sinusoidally in a manner suitable for driving alternating current (AC) motors. AC motors are used in many industrial applications such as robotics, servo drives and computer numeric controls. Pulse-width modulation is a way of describing a digital (binary/discrete) signal created through a modulation technique which involves encoding a message into a pulsing signal.

In examples of this disclosure, pulse-width modulation is used to control the amount of power supplied to electrical devices, including inertial loads (such as motors.) The average value of voltage (and current) fed to such a load is controlled by turning the switch between a power supply and a load on and off at a fast rate. The longer a switch is on compared the periods in which the switch is off, the higher the total power supplied to the load will be. In examples of this disclosure, the pulse-width modulation switching frequency is much higher than what would affect the load (the device that uses the power). The resultant waveform perceived by the load, such as a motor, is made as smooth as possible. Jitter is thus minimized.

There are times when it is necessary for a pulse-width modulator (PWM) to quickly shutdown one or more motors under the PWM's control, such as when there is an error condition. Examples of this disclosure pertain to apparatuses and ways of quickly turning off PWM-controlled devices while minimizing the likelihood of harm to people, motors and machines due to the shutdown.

Within this disclosure, the term 'event-indication signal' refers to a signal (within a device or network, for example) indicating a possible need for a pulse-width modulator (PWM) to quickly shutdown one or more motors, such as in a power stage shut-off. In examples of this disclosure, one or more event-indication signal(s) (EIS) can come from various sources. One or more examples of this disclosure pertain to systems and methods for managing EIS from such sources. At least one example of this disclosure concerns a method of reducing unnecessary EIS generation by such sources.

EIS can be caused by (operational errors in devices, circuits, components, etc. EIS can also correspond to glitches. Glitches include signals which are caused by minor operational errors which do not actually warrant a power stage shutdown. Glitches include short lived signal errors which can be caused by non-error events, such as electromagnetic disturbances caused by environmental factors. A glitch corresponds to a 'false positive' detection of an error event. At least one example of this disclosure is a method of mitigating the effects of glitches. In one or more examples, if a filter determines that an EIS is not due to a glitch, the filter will emit a trip event indication signal (TEIS); in the ideal case, all false positive EIS are filtered, and all true positive EIS are conveyed to a trip signal emitter, (such as logic circuit 421 shown in FIG. 4B). It is worth noting that EIS can be of varying length, and generally speaking, the longer that an EIS lasts, the greater is the likelihood that the EIS is indicative of a fault, rather than a mere glitch.

At least one example of this disclosure is a method of combing a plurality of TEIS into a single TEIS.

Examples of this disclosure include diagnostic mechanisms and methods for identifying EIS sources, determining with great accuracy when a given EIS-generating event occurred (to within a range of plus or minus three nanoseconds), and storing such source and timing information for consideration. Unlike conventional solutions, mechanisms and methods provide the ability to read back EIS source information and timing information for multiple events. The ability to respond to an error promptly is a corollary of accuracy in error-timing determination. For example, in implementations of technology of this disclosure, a power stage based on a field effect transformer (FET) must be turned-off within one microsecond of an error to avoid damaging the FET-based power stage. In some implementations, damage prevention requires that a FET-based power stage be shut-off before no more than 500 nanoseconds of an error condition has elapsed. For an error condition to be treated speedily, that error condition must be communicated to a shutdown mechanism quickly; the delay from detecting an error signal to tripping the PWM should be minimized.

Depending on the operational environment of a given ICSS, and taking into consideration propagation delays in the signal chain(s) of one or more devices with which the ICSS interacts (and/or communicates and/or controls), the longest acceptable delay between emission of an EIS and the utterance of a trip signal will be ten nanoseconds. However, as noted above, the longer an EIS lasts, the greater is the likelihood that the EIS is indicative of a fault, rather than a mere glitch. The converse is also true; the shorter an EIS, the greater is the probability that the EIS was caused by a glitch. Thus, there is a tradeoff between ensuring that errors are promptly addressed (such as by powering down a component) and avoiding acting on false positives (such as glitches caused by extraneous signal fluctuations).

In one or more examples of this disclosure, an ICSS user can adjust the response time to avoid acting on false detections. In some examples, the user can change the settings of a glitch filter, such as by lengthening or shorting the length of an EIS requiring it to send a TEIS to a trip signal controller (such as the logic circuit 421 illustrated in FIG. 4B). Typical glitch filter settings are from ten nanoseconds to 100 nanoseconds. In at least one example, if a glitch filter is not set to zero (0), the glitch filter will eliminate all noise, but, as explained, will also increase propagation delay. In some examples, the user can also adjust the sensitivity of the trip signal controller itself, (such as the logic circuit 421 illustrated in FIG. 4B). Here the user can increase or decrease the length of time required for the trip signal control to read one or more incoming TEIS (from one or more error signal sources, for example) before the trip signal controller will trip a PWM.

At least one example within this disclosure is a system which includes a position feedback interface, a motor current and voltage interface, a pulse-width modulator (PWM), a programmable real-time unit, and trip generation hardware, configured to generate, based on a set of static and/or dynamic input events, a trip signal for each motor being controlled by a given PWM. In one or more examples, the system is dynamically configurable. In at least one example, the system enables programmable selection of input events for trip signal generation logic. An example of this disclosure is a system configured to enable programming of event-based glitch mitigation.

At least one example of this disclosure is a programmable state machine having an active state and a reset state. In some examples within this disclosure, a reset state is used for pulse-width modulation cycling. In one or more examples, a reset state is controlled by a software reset and/or a timer. In an example of this disclosure, a system includes a reset function which enables one-shot and/or cycle-by-cycle EIS analysis.

An example of this disclosure is a configurable hardware state machine capable of managing pulse-width modulation and with minimal latency. An example of this disclosure is a configurable hardware state machine capable of managing power stage shut-downs, regardless of the source(s) of the event(s) necessitating such power stage shut-down. In at least one example, all EIS inputs are ingested by a single hardware device with minimal latency and minimal jitter for EIS management.

When used in this disclosure, the term jitter refers to the deviation from true periodicity of a presumably periodic signal, often in relation to a reference clock signal.

In examples of this disclosure, a communication protocol is a system of rules that allow two or more entities of a communications system to transmit information. Certain communication protocols such as EtherCAT (Ethernet for Control Automation Technology) can have multiple datagrams within one packet which requires parsing the packet multiple times with variable start offset. EtherCAT is an Ethernet-based fieldbus system. A fieldbus system is an industrial network system for real-time distributed control. The EtherCAT protocol is standardized in IEC 61158 and is suitable for both hard and soft real-time computing requirements in automation technology. Real-time systems like EtherCAT require their data packets to be parsed during receive process and make processing/forwarding decision—such as where to send a received packet—before the end of the packet has been reached during the receive process.

As noted, many different communication protocols have been developed across different industries and market segments to address real-time communication for data exchange running on proprietary developed processing devices, such as SoCs, DSPs, ASICs and FPGAs. Examples of this disclosure are directed towards providing and/or enabling multi-protocol flexibility for communication between such processing devices. At least one example of this disclosures is directed to providing and/or enabling real-time Ethernet communication at speeds of 1 Giga-bit/sec or faster.

At least one example of this disclosure is an architecture for an industrial communication subsystem (ICSS) which addresses the flexibility requirement of multi-protocol and the performance requirement of real-time gigabit Ethernet. With the integration onto catalog processors, it makes industrial communication as easy as standard Ethernet. An ICSS has a hybrid-architecture. In one example, an ICSS includes four 32-bit reduced instruction set computer (RISC) cores called programmable real-time units (PRU) coupled with a set of tightly integrated hardware accelerators. A reduced instruction set computer (RISC) is a computer whose instruction set architecture (ISA) allows it to have fewer cycles per instruction (CPI) than a complex instruction set computer (CISC).

Figure 2A:
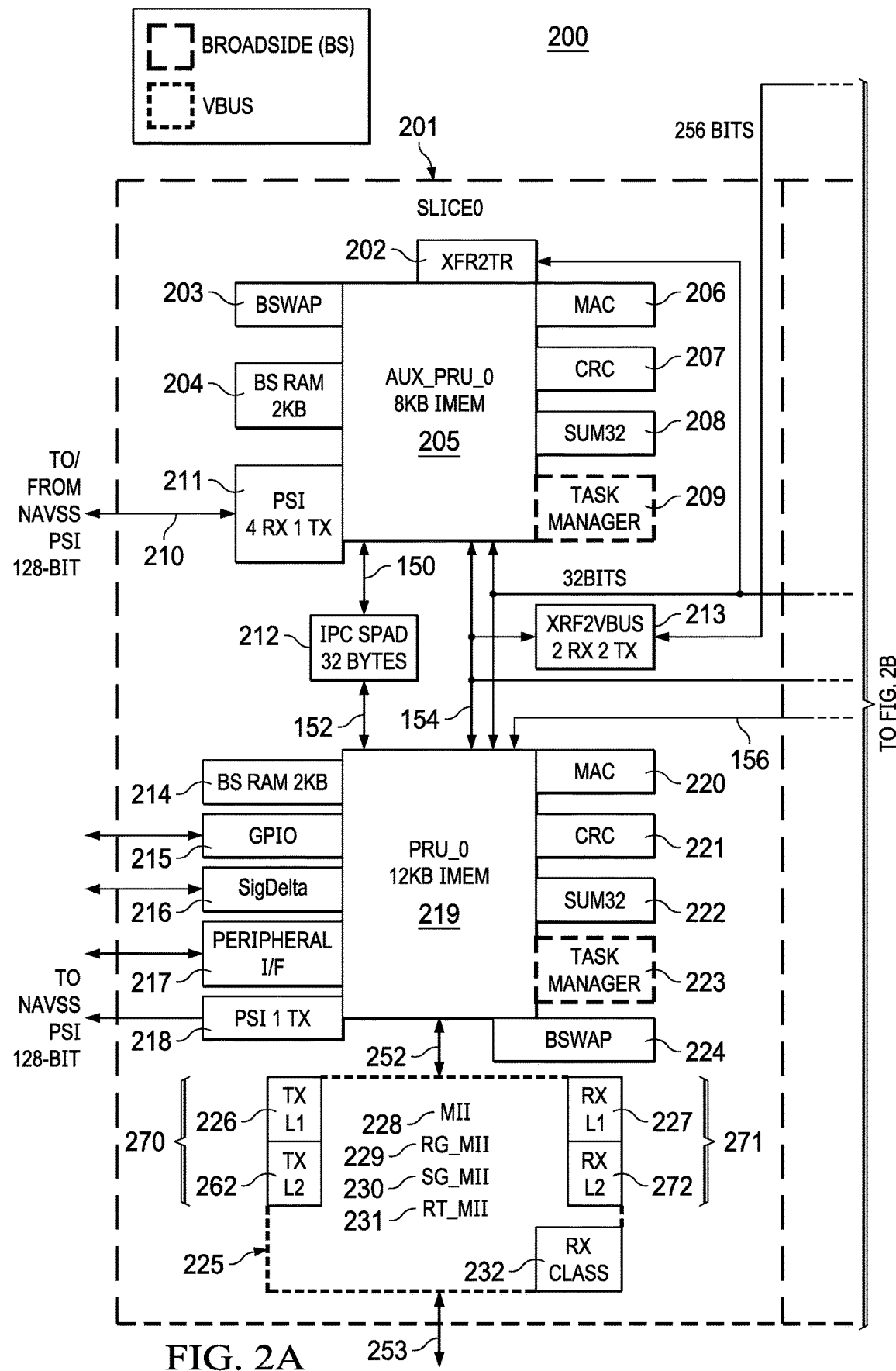
FIG. 2A illustrates a first communication-and-control portion of a system such as that illustrated in FIG. 1, in accordance with an example of this disclosure.
Figure 2B:
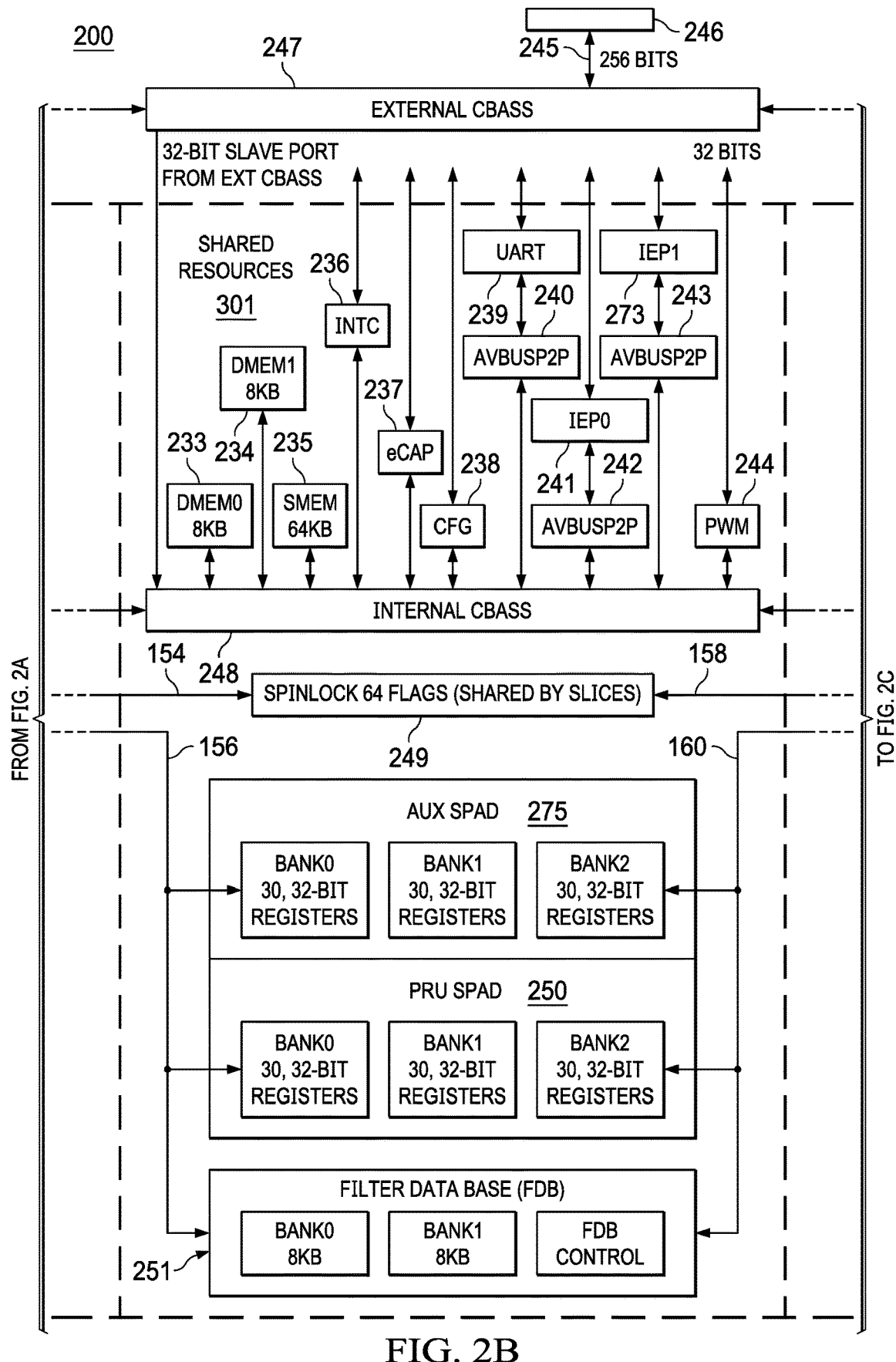
FIG. 2B. illustrates a shared-components portion of a system such as that illustrated in FIG. 1, in accordance with an example of this disclosure.
Figure 2C:
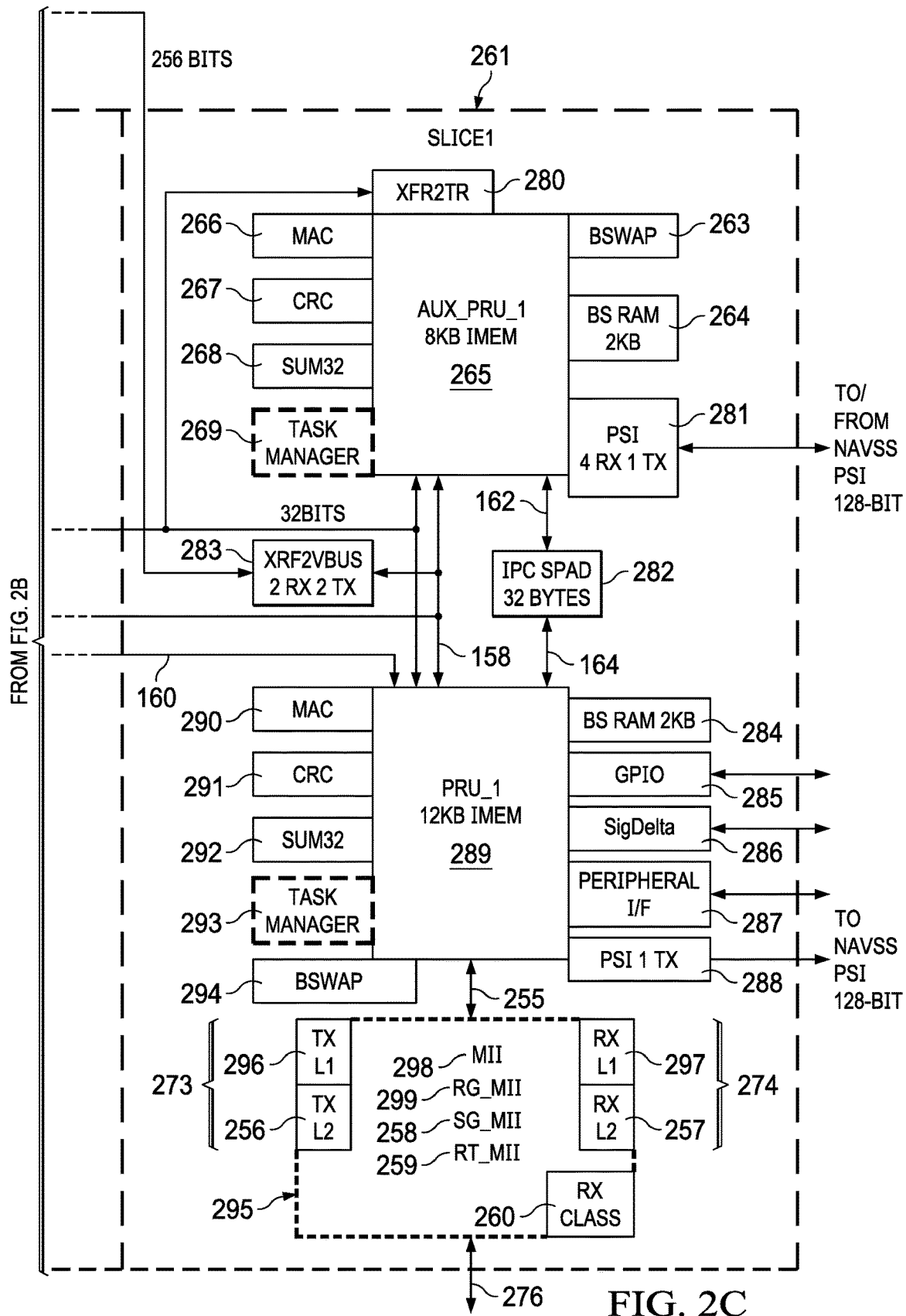
FIG. 2C illustrates a second communication-and-control portion of a system such as that illustrated in FIG. 1, in accordance with an example of this disclosure.

The combination of 128/256 gigabit/sec data transfer with deterministic programming resolution of four nanoseconds (ns) is a highly differentiated approach to communication interfaces. A detailed view of the hardware accelerators in combination with a 128/512 giga-bit/second data bus architecture is illustrated in FIGS. 2A-C.

Examples of this disclosure pertain to a programmable real-time unit subsystem and industrial communication subsystem (PRU-ICSS) which includes dual 32-bit RISC cores (PRUs), data and instruction memories, internal peripheral modules, and an interrupt controller (INTC). The programmable nature of the PRU-ICSSs, along with their access to pins, events and all SoC resources, provides flexibility in implementing fast real-time responses, specialized data handling operations, control of peripheral interfaces, and in offloading tasks from the other processor cores of the system-on-chip (SoC).

For Industrial Ethernet use cases, an ICSS can require a tradeoff between programmability (flexibility) and the need to keep up with wire rate packet load. In one example, the programmable components (PRUs) will run at a 250 MHz clock and thus the firmware (f/w) budget is limited to approximately 84 cycles per packet (for minimum size transmits and receive frames). This can be insufficient for full 802.1D compliant packet processing at 1 GHz rates. Hence, example ICSSs of this disclosure include hardware (HW) accelerators for time consuming bridging tasks.

A PRU microprocessor core, in accordance with disclosed examples, has a load/store interface to external memory. Using data I/O instructions (load/store), data may be read from or written to external memory, but at a cost of stalling the core while the access is being made. A read of N–32 bit words typically takes around 3+N cycles, while a write takes around 2+N cycles.

In at least one example, a broadside RAM and/or broadside interface is optimized for wide transfers of 32 bytes. Lower transfer widths can be supported by padding the size to 32 bytes. In at least one example, the read location is first written to the attached RAM using the xout broadside instruction, and then the data is read using the xin broadside instruction. Thus, read operations will take two cycles. For write transfers, the address is placed in the register just after the registers holding the 32 bytes of data, and the data plus address is transferred to the attached RAM in one xout instruction. In at least one example, this approach has the extra advantage of being able to also perform operations on the data, possibly in parallel with the transfer.

In addition to speeding up writes and transfers, examples of this disclosure provide advantages such as a glue logic between the RAM and the broadside interface locally stores the RAM address last accessed which allows for an auto-increment mode of operation so firmware does not have constantly update the address (especially useful for bulk reads). Examples of this disclosure enable useful operations on data using this interface in parallel with write operations. For example, cut through data can be run through a checksum circuit to compute a running checksum of a packet while it is stored in the RAM. In at least one example, a processor can perform endian flipping on data within a packet, at various data size boundaries. In at least one example, a data pivot/swap operation can be performed using this interface, for example to swap registers r2-r5 with r6-r9. This is useful when moving data between interfaces with different block sizes (e.g., 32-byte RX FIFO and 16-byte PSI interface). In an alternate example, by using a different broadside identifier (ID) (a parameter to of broadside instructions), to associate an organization to the attached memory or to enable independent memory 'views' by different firmware tasks. The broadside IDs can map to different read or write memory address (maintained by glue logic) so that data structures such as FIFOs (first in first out) and queues can by implemented by the attached RAM in a flexible and firmware managed manner. At least one example utilizes embedded processing.

In at least one example of this disclosure, ingress filter hardware in combination with an ingress classifier enables hardware decisions for real-time forwarding and processing. Such filter hardware is placed at a variable and content dependent start address, re-loaded within a packet with variable and content dependent start address, masked for applying range of addresses and compared with greater than and less than operations.

In an example of this disclosure, multiple hardware filters can be combined with binary logic to form a complex receive decision matrix. In an example, multiple hardware filters can be combined with a time window for time aware receive decisions. Multiple hardware filters can also be combined with rate counters for rate-limited receive decisions.

In at least one example of this disclosure, a hardware filter and classifier enable receive and forwarding decisions relating to packets with relatively little bridge delay. In an example, a combination of content, time window and data rate provide a robust ingress classification for Ethernet bridge while maintaining relatively little bridge delay. As will be explained in greater detail below, examples of this disclosure enable bridge delays of less than a microsecond.

FIG. 1 is a functional block diagram of a system 100 (which can be a component of a SoC 130) based on ICSS architecture in accordance with one example of this disclosure. In FIG. 1, a 16-Kilobyte broadside random-access memory (BS-RAM) 101 is coupled to (in signal communication with) AUX_PRU 112. The BS-RAM 101 is coupled to the PRU 116 via AUX_PRU 112. BS-RAM 101 can transfer 32 bytes of data in one clock cycle of the system 100. BS-RAM 101 has an ultra-high bandwidth and ultra-low latency. Within this disclosure, coupled components (e.g., circuits) are able to communicate with each other. Connected components are those which are coupled via a direct connection or an indirect connection. Within this disclosure, components which are coupled to one another are also connected, unless an indication to the contrary is provided.

As illustrated in FIG. 1, data coming in through interface circuit 104 (which is a real-time interface) is passed to FIFO receive circuit 105. As data goes through the receive circuit 105, classifier 108 is applied to this incoming data. The filter 106, the rate counter 107, and combinational logic of classification engine 108 are applied to received data packets.

Management data input/output (MDIO) circuit 102 is a media interface. MDIO circuit 102 uses PRU 116 to communicate with an external reduced gigabit media-independent interface (RGMII) physical layer and a media-independent interface (MII) physical layer, (interface circuit 104, interface circuit 119). MDIO circuit 102 has low latency and is dedicated to PRU 116. As shown in FIG. 1, the system 100 also includes a statistics counter circuit 103, which tracks statistics of the Ethernet ports of real-time interface circuit 104, such as packet sizes, errors, etc. Real-time interface circuit 104, comprising RGMII, serial gigabit media-independent interface (SGMII), and real-time media-independent interface 231, 259 (RTMII) is a hardware layer which connects to the input/outputs (IOs) of system 100, such as MDIO circuit 102. Real-time interface circuit 104 is coupled to FIFO receive circuit 105, which includes a level one first-in-first-out (FIFO) receiving layer (RX_L1) and a level two FIFO receiving layer (RX_L2). FIFO receive circuit 105 can receive level one FIFO data and level two FIFO data.

As noted, system 100 includes filter 106, which is a filter for eight filter type 1 data streams and/or sixteen filter type 3 data streams. Filter 106 determines whether a given data packet is a particular "type" of data packet. Filter type 3 data packets have a variable start address depending on whether packets are communicated with a virtual LAN. System 100 also includes a rate tracker 107. In at least one example, the system 100 includes eight rate trackers 107. Based on a filter type hit rate, rate tracker 107 calculates the throughput rate of FIFO receive circuit 105. The system 100 also includes filter database (FDB) 109. FDB 109 is used for routing and redundancy. Receive circuit 105 includes a level one receiving layer (RX_L1) and a level two receiving layer (RX_L2), which include physical receive ports. Level one receiving layer (RX_L1) and level two receiving layer (RX_L2) of receive circuit 105 can access FDB 109 to manage receiving and forwarding decisions based on an IEEE802.1Q learning bridge mode 1. FDB 109 contains a lookup table (LUT) storing results which can be given to PRU 116 to assist PRU 116 in making data routing decisions. In at least one example, system 100 also includes virtual local area network tag (VLAN TAG) circuit 110. (A tag (a/k/a 'ID') is a keyword or term assigned to a piece of information (such as an Internet bookmark, digital image, database record, computer file, or VLAN). Statistics tracker 103, filter 106, rate tracker 107, classifier 108, FDB 109, and (optionally) VLAN TAG 110 are aspects of receive circuit 105.

MDIO circuit 102 controls interaction with the external physical layer (not shown) of the system in accordance with the open systems interconnection (OSI) model. The physical layer connects a link layer device such as medium access controller (MAC) (see 206 (266) and 220 (290) of FIG. 2A, and 266 and 290 of FIG. 2C) to a physical medium of a host (e.g., 246) device/system) of which the subsystem 200 is a component or to which the subsystem 200 is coupled. The physical layer includes both physical coding sublayer (PCS) functionality and physical medium dependent (PMD) layer functionality. There is a transceiver external to the SoC 130 in which system 100 is embedded. The MDIO circuit 102 configures one or more external physical layers (not shown) and serves to minimize latency of the ICSS.

Every central processing unit (CPU), such as programmable real-time unit 116 includes a task manager circuit (e.g., task manager circuit 111). In at least one example, task manager circuit 111 and task manager circuit 121 can recognize 200 events or more. Events correspond to hardware status signals such as from the filter 106, from the rate tracker 107, or from interrupt controller 123. AUX_PRU 112 is responsible for control. For instance, based upon a starter frame, PRU-RTU 112 detects that a new packet is going to the data processor—PRU 116—and, in parallel to the data processor's collecting the data, PRU-RTU 112 will set up the address and direct memory access (DMA) per packet as needed for the packet to go to the host (130, 246). While data is being pushed to the BS-RAM 117, the data can also be pushed to a checksum accelerator such as CRC 120. Thus, CRC 120 can hang off of BS-RAM 117. Transfer circuit 113 communicates with AUX_PRU 112 and PRU 116. Transfer circuit 113 can receive (RX) and transmit (TX) information, as indicated by the notation 'RX/TX' in FIG. 1. Transfer circuit 113 is configured with DMA, which enables both AUX_PRU 112 and PRU 116 to access main system 100 memory. When AUX_PRU 112 or PRU 116 initiates a transaction, transfer circuit 113 will manage data movement to SoC 130 memory to either pull or push data. Transfer circuit 113 is thus a general asset that can be used for data transfers. In at least one example, in the architecture of FIG. 1, the AUX_PRU 112 can control address location while the PRU 116 pushes data. Thus, the architecture is flexible in that a single CPU e.g., (112, 116) is not responsible for both data management and control functions.

In at least one example subsystem 100, there exists a fabric having local memory. The fabric in the example subsystem 100 of FIG. 1 can be 4-byte wide. There are however, two banks of data memory 114 dedicated to each CPU (e.g., 112, 116), and another bank of larger memory 115 is shared across CPUs (112, 116). Data memory 114 can be used with scratchpad 126 and scratchpad 127, while shared memory 115 is used for a link-list which is used for DMA or for storing metadata. A scratchpad 126, 127 is like BS-RAM 101,117. Scratchpad 126 and scratchpad 127 are different from BS-RAM 101 and BS-RAM 117 however, in that scratchpads 126, 127 are shared amongst slices (see slice_0 of FIG. 2A and slice_1 of FIG. 2C) and, scratchpads 126, 127 are more flexible than BS-RAM 101,117. A scratchpad (e.g., 126, 127) can save and/or restore a register set. Scratchpads 126, 127 can be used for slice to slice communication and to perform barrel shifting or remapping of a register set to a physical location. BS-RAM 117 is similar to BS-RAM 101 except BS-RAM 117 also has a FDB which includes a look up table. When a packet comes in enters system 100 at receive circuit 105, hardware performs a look up to FDB 109 and presents the data to the PRU 116. Based on the response of the FDB of BS-RAM 117, the PRU 116 makes a routing decision, such as whether to route the received packet to the host via transfer circuit 113 and/or to a different port, such as through transmit circuit 118. PRU 116 also accesses BS-RAM 125. PRU 116 acts as a switch, while BS-RAM 117 enables actions to be performed concurrently. BS-RAM 117 is thus a dual use component. Hardware can be connected to the BS-RAM 117 while the BS-RAM 117 performs look ups to the FDB 109 for the PRU 116. Just as a check sum can be performed by CRC 120 at the same time RAM (e.g. 114) is being loaded, while the BS-RAM 125 is interacting with hardware, an FDB operation can be performed by BS-RAM 117 for PRU 116.

Transmit circuit 118 handles the egress of data from the PRU 116. Transmit circuit 118 performs preemption, tag insertion, and padding. Transmit circuit 118 enables firmware to terminate a packet cleanly. Thereafter task manager circuit 121 will perform the necessary steps to generate a final CRC and the transmit circuit 118 will perform padding if the packet in question is small. The transmit circuit 118 can insert a tag so that PRU 116 does not have to keep track of the packet. The transmit circuit 118 is thus able to assist the hardware of the SoC 130. The transmit circuit 118 is coupled to interface circuit 119. Interface circuit 119 is a final layer. External to transmit circuit 118 there exist different media independent interfaces, for example RGMIIs, SGMIIs, and real-time Mils (see 104, 119, 225 (295)). Other types of interfaces on the system 100 are also possible within this disclosure. FIFO transmit circuit 118 is agnostic with respect to such interfaces. Interface circuit 119 is a de-multiplexer. Interface circuit 119 provides protocol conversion for transmit circuit 118, enabling transmit circuit 118—and hence PRU 116—to communicate with a given piece of hardware in a protocol which is suitable for that hardware. PRU 116 and transmit unit 118 are thus not constrained to operating in a manner which corresponds to only one protocol, making PRU 116 and transmit circuit 118 more versatile than they would be absent interface circuit 119. In at least one example of this disclosure, the system 100 pins down data streams of interface circuit 119 to connect to an external physical layer. Transmit circuit 118 has a level one FIFO transmit layer (TX_L1) and a level two FIFO transmit layer (TX_L2), referring to levels of the open systems interconnection (OSI) model. Level (or 'layer') one corresponds to the physical layer of the OSI model and level two corresponds to a data link layer of the OSI model. This dual layer connectivity provides options. For example, the level two FIFO transmit layer (TX_L2) can be bypassed and data can be sent to the level one FIFO transmit layer (TX_L1), which reduces latency. In at least one example, the level two FIFO transmit layer (TX_L2) has a wider interface than does the level one FIFO transmit layer (TX_L1). In at least one example, the level two FIFO transmit layer (TX_L2) has a 32-byte interface, whereas the level one FIFO transmit layer (TX_L1) has a 4-byte interface. In at least one example, if at the receive circuit 105 a data packet goes from level one receiving layer (RX_L1) to the level two receiving layer (RX_L2) 272 (257), and the PRU 116 accesses the packet at the level two receiving layer (RX_L2), the data will be pushed to the level two FIFO transmit layer (TX_L2) of FIFO transmit circuit 118 first, and then the hardware of FIFO transmit circuit 118 will push the data packet directly to the level one FIFO transmit layer (TX_L1). However, when communicating with ultra-low latency interfaces such as EtherCAT, the level two FIFO transmit layer (TX_L2) can be bypassed; the data that is output from PRU 116 can be pushed directly to level one FIFO transmit layer (TX_L1), (which, as noted, has a 4-byte width).

Interface circuit 104 and interface circuit 119 are at level zero of the OSI model. Data thus enters system 100 at level zero through interface circuit 104, is moved from level zero to either level one receiving layer (RX_L1) of FIFO receive circuit 105 or level two receiving layer (RX_L2) 272 (257) of FIFO receive circuit 105, to the PRU 116, (which exists at both level one and level 2), and from level one or level two of PRU 116 through the FIFO transmit circuit 118 and back down to level zero at interface circuit 119. In at least one example, cyclical redundancy check (CRC) circuit 120 is an accelerator which assists PRU 116 perform calculations. The PRU 116 interfaces with the CRC circuit 120 through BS-RAM 117. The CRC circuit 120 applies a hash function to data of the PRU 116. The CRC circuit 120 is used to verify the integrity of data packets. For example, all Ethernet packets include a CRC value. The CRC circuit 120 performs a CRC check on a packet to see if the CRC value of the packet agrees with the result calculated by the CRC circuit 120. That is, a packet includes a CRC signature and after the signature is calculated, the result is compared with the signature that is attached to the packet to verify the integrity of the packet.

System 100 also includes interrupt controller (INTC) 123. INTC 123 aggregates and CPU (e.g., AUX_PRU 112, PRU 116) level events to host (e.g., 130, 146) events. There may be, for example, ten host events. INTC 123 determines that a given set of slave level events should be aggregated, mapped, and classified down to a single entity. The single entity can be routed to and used by the PRU 116 or the task manager circuit 121 to cause an event for the host (130, 146). In that sense, INTC 123 is both an aggregator and a router.

Enhanced/external capture (eCAP) circuit 124 is a timer which enables PRU 116 to generate an output response based upon a time match with industrial Ethernet peripheral (IEP) circuit 122, and captures event time for events external to system 100.

IEP circuit 122 has two sets of independent timers which enable time synchronization, time stamping, and quality of service for egress of data out of system 100. There are several independent capture circuits associated with IEP circuit 122. For example, if there is a receive (RX) starter frame event and it is important the frame be pushed to the host at a specific time, the IEP circuit 122 can time stamp the event to indicate that specific time. If the event is a time triggered send for the egress circuit 118, if it is desirable to transfer a packet at a precise time (within 2-3 nanoseconds), transmission of the packet begins when the timer expires, independent of the PRU 116. Thus, the transfer of the packet is effectively decoupled from the PRU 116.

In addition to the timers described, IEP circuit 122 also contains enhanced digital input/output interfaces (EDIO). An EDIO is similar to a general-purpose input/output (GPIO) interface, but is more intelligent and better calibrated for Ethernet communications. For example, a transmit-started or receive-started frame might cause an event on the EDIO which can in turn cause an event external to the SoC 130. Sync-outs and latches-in are part of time synchronization. It is also possible for IEP 120 to receive a frame and capture an analog voltage. In conventional systems this would require a read operation. But with EDIO, a capture can be event triggered and/or time triggered, thus making capture more precise than in conventional systems. The EDIO enables the system 100 to determine with precision when an incoming frame arrives, which in turn enables the system 100 to sample one or more specific values (such as temperature, voltage, etc.) and track with precision when a sample was taken because of time stamping by the IEP circuit 122. The frame in question can be augmented. When the frame is transmitted by transmit circuit 118 the frame can contain the time-stamped sampled value without leaning overhead or latency. IEP circuit 122 also includes a watch dog (WD) timer. Certain events should occur under normal operating conditions. When such events occur, the PRU 116 will normally clear the WD timer. If the WD timer fires that means the PRU 116 did not clear the WD timer in time, or did not reset the WD timer in time, which indicates there was a stall or some type of latency that was not expected. The WD timer thus serves to track errors.

As noted, task manager circuit 111 and task manager circuit 121 can recognize a great number of events. PRU 116 is the main data engine of system 100. When a frame is started, the system 100 begins preparing and servicing receiving circuit 105. Once a frame is in transmit circuit 118, inputting of the next packet can begin. Because the PRU 116 is the main processor, the PRU 116 needs to have access to all events in real-time. Another operation associated with PRU 116 is watermarking. A watermark can be created at interface circuit 105, receive circuit 105, transmit circuit 118, and interface circuit 119. It is undesirable too wait until the FIFO is full before loading or unloading packets because that would be too late, and it is undesirable to wait until the FIFO is empty because that would be too early, when a certain amount of emptiness (or fullness) is reached, task manager circuit 121 can fire, and the PRU 116 will determine whether the packet will be watermarked.

An aspect of the BS-RAM 117 is that it enables PRU 116 to snoop the packet at the same time the system 100 can save contexts and variables at the BS-RAM 117 and operations can be performed on the contexts and variables with no overhead costs because the data of the packet does not need to be moved twice. In at least one example of this disclosure, an incoming data packet can be moved to a storage location and at the same time the data is operated upon. This differs from conventional systems which move an incoming packet to a processing circuit and subsequently to a storage location. The system 100 thus performs a single operation where a conventional system would perform two.

As noted, AUX_PRU 112 interacts with BS-RAM 101. AUX_PRU 112 has a task manager circuit 111 which can preempt PRU 116 based on the occurrence of certain events or context swaps. AUX_PRU 112 also interacts with transfer circuit 113. In at least one example, a system 100 in accordance with this disclosure also includes eight kilobytes of data RAM 114 and 64 kilobytes of shared RAM 115. AUX_PRU 112 and transfer circuit 113 both interact with PRU 116. Task manager circuit 121 enters real-time tasks for receive and transmit processing based on FIFO watermarks. PRU 116 is also coupled to 16-kilobyte BS-RAM filter database 117. Output from PRU 116 goes to FIFO transmit circuit 118. In turn, output from FIFO transmit circuit 118 goes to real-time interface circuit 119. PRU 116 also interacts with CRC 120, which calculates checksums inside an ethernet packet. In at least one example, system 100 includes IEP/timer/EDIO/WD circuit(s) 122. As noted, the system 100 can also include interrupt controller (INTC) 123 and eCAP circuit 124.

FIGS. 2A-C illustrate an example industrial communication subsystem (ICSS) (hereinafter simply subsystem 200). FIGS. 2A-C illustrate many of the same components as shown in FIG. 1, but in varying detail. Descriptions set forth regarding FIG. 1 are germane to FIGS. 2A-C, and vice versa. Slice_0 201, on the left of internal bus 248 and external bus 247, is symmetrical to slice_1 261 on the right. (Note, like alphabetical designations indicate like components.) Descriptions of components in slice_0 201 apply to their counterparts in slice_1 261. As illustrated in FIG. 2, subsystem 200 includes processing hardware elements, such as auxiliary programmable real-time unit (AUX_PRU_0) 205 and PRU_0 219 which contain one or more hardware processors, where each hardware processor may have one or more processor cores. In at least one example, the processor (e.g., AUX_PRU_0 205, PRU_0 219) can include at least one shared cache that stores data (e.g., computing instructions) that are utilized by one or more other components of the processor (AUX_PRU_0 205, PRU_0 219). For example, the shared cache can be a locally cached data stored in a memory for faster access by components of the processing elements that make up the processor (AUX_PRU_0 205, PRU_0 219). In some cases, the shared cache can include one or more mid-level caches, such as a level 2 cache, a level 3 cache, a level 4 cache, or other levels of cache, a last level cache, or combinations thereof. Examples of processors include, but are not limited to a CPU microprocessor. Although not explicitly illustrated in FIG. 2, the processing elements that make up processor AUX_PRU_0 205 and processor PRU_0 219) can also include one or more other types of hardware processing components, such as graphics processing units, ASICs, FPGAs, and/or DSPs. Another accelerator of PRU_1 is BSWAP circuit 224 (294). BSWAP circuit 224 (294) can swap words depending on the size of the packet in question, little endian and/or big endian. BSWAP circuit 224 (294) can re-order of the bytes in a packet, depending on the word size.

Subsystem 200 includes slice_0 201 which is mirrored by slice_1 in FIG. 2C. As can be seen in FIG. 2A, slice_0 201 has multiple components. The main components are auxiliary PRU (AUX_PRU_0) 205, PRU_0 219 and MII 25. AUX_PRU_0 205 has a number or accelerators (a/k/a widgets). AUX_PRU_0 205 serves as the control processor of slice_0 201. Throughout this disclosure, the terms 'control processor,' 'AUX_PRU,' and 'RTU_PRU' are synonymous and interchangeable unless indicated otherwise or dictated by the context in which they appear, though their functions and configurations can differ.

FIG. 2A illustrates that memory (e.g., 204 (264)) can be operatively and communicatively coupled to AUX_PRU_0 205. Memory 204 (264) can be a non-transitory medium configured to store various types of data. For example, memory 204 (264) can include one or more storage devices which comprise volatile memory. Volatile memory, such as random-access memory (RAM), can be any suitable non-permanent storage device. In certain instances, non-volatile storage devices (not shown) can be used to store overflow data if allocated RAM is not large enough to hold all working data. Such non-volatile storage can also be used to store programs that are loaded into the RAM when such programs are selected for execution.

Software programs may be developed, encoded, and compiled in a variety of computing languages for a variety of software platforms and/or operating systems and subsequently loaded and executed by AUX_PRU_0 205. In at least one example, the compiling process of the software program may transform program code written in a programming language to another computer language such that the AUX_PRU_0 205 is able to execute the programming code. For example, the compiling process of the software program may generate an executable program that provides encoded instructions (e.g., machine code instructions) for AUX_PRU_0 205 to accomplish specific, non-generic computing functions.

After the compiling process, the encoded instructions can then be loaded as computer executable instructions or process steps to AUX_PRU_0 205 from storage 220 (290), from memory 210, and/or embedded within AUX_PRU_0 205 (e.g., via a cache or on-board ROM). In at least one example AUX_PRU_0 205 is configured to execute the stored instructions or process steps to perform instructions or process steps to transform the subsystem 200 into a non-generic and specially programmed machine or apparatus. Stored data, e.g., data stored by a storage device 220 (290), can be accessed by AUX_PRU_0 205 during the execution of computer executable instructions or process steps to instruct one or more components within the subsystem 200.

FIG. 2B illustrates component and resources shared by slice_0 of FIG. 2A and slice_1 of FIG. 2C. FIG. 2C comprises the same hardware as FIG. 2A. Slice_0 201 and slice_1 261 are symmetrical about FIG. 2B. Descriptions within this disclosure pertaining to FIG. 2A apply mutatis mutandis to FIG. 2C. Subsystem 200 include subsystem 200 also includes at slice_0 201 and a corresponding port 276 on slice_1 261. There is a third port (see FIG. 130), host port 245, the host port 245 connects subsystem 200 to the host 246, of which subsystem 200 can be a component. Port 253 and port 276 can both be connected to the Ethernet. Subsystem 200 can thus serve as a three-port switch. Host 246 can be a local source/sync or a SoC (130). While subsystem 200 option can be an SoC (130) in and of itself, in some implementations, subsystem 200 will be a subcomponent of a greater SoC (130). The host 246 will, in some examples, be a CPU from ARM Holdings PLC of Cambridge, England, UK. In at least one example, host 246 comprises several CPUs. There is exist a variety of CPUs. An example of a small CPU is the Arm Cortex-R5-CPU. An example of a large CPU is the Arm Cortex-A57-CPU. In at least one example subsystem 200 can be controlled by another such CPU.

Subsystem 200 includes as shown, XFR2TR circuit 202 (FIG. 2A) interacts with internal configurable bus array subsystem (CBASS) 248 (FIG. 2B). The 'XFR' in XFR2TR circuit 202 (280) stands for transfer. XFR2TR circuit 202 (280) has a broadside interface. XFR2TR circuit 202 (280) is abutted to AUX_PRU_0 205 via the broadside interface of the XFR2TR circuit 202 (280). Internal register sets of the AUX_PRU_0 205 are exposed to accelerators MAC 206, CRC 207 (267), SUM32 circuit 208 (268), byte swap (BSWAP) circuit 203 (263), and BS-RAM 204 (264). In at least one example subsystem 200 of this disclosure, internal register sets of AUX_PRU_0 205 are directly exposed to accelerators such as those referenced above, differs from the architectures of conventional systems. In conventional systems a load-store operation over the fabric would be required for the AUX_PRU_0 205 to access an accelerator. In the example shown in FIG. 2, however, the accelerators are—in effect—part of the data path of AUX_PRU_0 205. The AUX_PRU_0 205 can import and export its register files to a given accelerator (a/k/a 'widget') based upon a given register's broadside ID. For example, XFR2TR circuit 202 (280), which is part of a DMA, can perform a transfer request. A transfer request (TR) can begin with a start address to start data movement a designation of the amount of data to be moved (for example, 200 bytes). XFR2TR circuit 202 (280) can perform a simple DMA memory copy of SMEM 235 which contains a list of predetermined transfer requests (TRs). Software running on AUX_PRU_0 205 is aware of the list of preexisting TRs of SMEM 235. In operation, AUX_PRU_0 205 sends an instruction to a DMA engine to move data. Since transfer instructions can be extremely complicated and/or complex, predefined instructions reside within a 'work order pool' stored in SMEM 235. Based on the type of packet in question, AUX_PRU_0 205 determines which 'work orders' should be used, and in what sequence, to cause the packet to be sent to the correct destination. The XFR2TR circuit 202 (280) can create a work order list as directed by AUX_PRU_0 205, and once the work order list is created, the XFR2TR circuit 202 (280) will notify a DMA engine (not shown). The DMA engine will then pull the designated work orders from SMEM 235 and execute the pulled work orders. The XFR2TR 202 (280) thus minimizes the computational overhead and transfers necessary to build a DMA list, like a link list to perform the data movement. TR stands for transfer request.

Another accelerator of AUX_PRU_0 is BSWAP circuit 203 (263). BSWAP circuit 203 (263) can swap words depending on the size of the packet in question, little endian and/or big endian. BSWAP circuit 203 (263) can re-order of the bytes in a packet, depending on the word size. BSWAP circuit 203 (263) is thus an accelerator which will automatically perform such swaps. BS-RAM 204 (264) corresponds to the BS-RAM 101 discussed regarding FIG. 1. BS-RAM 204 (264) is tightly coupled to AUX_PRU_0 205. When the AUX_PRU_0 205 pushes data element to BS-RAM 204 (264), a CRC for that element can be calculated simultaneously by CRC 207 (267) or a checksum for the data element be calculated simultaneously by checksum circuit 208. Based upon the data packet's ID, the AUX_PRU_0 205 will snoop for the necessary transaction(s), (for example checksum, multiply, accumulate, etc.) concurrently, meaning that pushing the data element to BS-RAM 204 (264) and performing an accelerator action constitute a single transaction rather than a double transaction. This simultaneity of operations is enabled by the BS-RAM 204 (264) in that BS-RAM 204 (264) can enable and/or disable the functions of the widgets while data is being transferred to physical RAM (for example, data RAM 114 and shared RAM 115 shown in FIG. 1).

Peripherals BSWAP 203 (263), XFR2TR circuit 202 (280), MAC 206 (266), CRC 207 (267), and SUM32 208, while illustrated as external to BS-RAM 204 (264) for explanatory purposes, will, under most operating conditions, be embedded within BS-RAM 204 (264). Multiplier-accumulator (MAC) 206 (266) is a simple accelerator comprising a 32-bit by 32-bit multiplier and a 64-bit accumulator. Cyclic redundancy check (CRC) circuit 207 (267) performs redundancy checks cyclically. CRC circuit 207 (267) supports different polynomials. Checksum circuit 208 is like CRC circuit 207 (267) except that checksum circuit 208 uses a hash operation to determine the integrity of a payload at AUX_PRU_0 205 before performing a checksum on the payload.

Task manager circuit 209 is a key part of AUX_PRU_0 205. Task manager circuit can prompt AUX_PRU_0 205 to execute a given function based on which of the 196 events is detected.

There are two ways that data can be moved in and out of the subsystem 200 and to and from SoC 130 memory and/or to an external device. One way is through the packet streaming interface (PSI) 211 (281), which provides the ability to push data to a host (e.g., 246) and to pull data from the host (e.g., 246). This action of PSI 211 (281) is unlike a read request. Rather the master (writer) component of PSI 211 (281) is attached to AUX_PRU_0 205. There is a mapping of received packets to a destination. The destination, under normal operating conditions, will be ready to receive the packets. For that reason, PSI 211 (281) does not read data, but instead transmits data to a destination endpoint. PSI 211 (281) receives data from and sends data to navigation subsystem (NAVSS) 210. NAVSS 210 enables complex data movement. NAVSS 210 has a DMA engine and an advanced TR called a re-engine. NAVSS 210 supports PSI 211 (281) and can map PSI 211 (281) to other devices, such as via peripheral component interconnect express. Using PSI 211 (281), data can go directly from ICSS to peripheral component interconnect express while bypassing the host and/or a main DMA engine, enabling streaming data from one Ethernet interface (for example, interface circuit 225 (295)) and to another interface such as a universal serial bus or peripheral component interconnect express.

AUX_PRU_0 205 communicates with inter-processor communication scratch pad (IPC SPAD) 212 (282), which in turn also communicates with PRU_0 219. IPC SPAD 212 (282) is not a temporary SPAD that is owned by a single CPU. In at least on the purpose of IPC SPAD 212 (282) is to be able to transfer data or full controller status across AUX_PRU_0 205 and PRU_0 219. Transfer-to-virtual-bus circuit (XFR2VBUS) circuit 213 (or simply 'transfer circuit 213') corresponds to the transfer circuit 113 shown in FIG. 1 and operates in the same way as transfer circuit 113. Transfer circuit 213 (283) is attached to BS-RAM 214 (284). Transfer circuit 213 (283) has a broadside interface with external CBASS 247, internal CBASS 248, and spinlock circuit 249. Transfer circuit 213 can request reads and writes from memory (e.g., 204, 214) to broadside, and from broadside to memory. This read/write function is different from a read/write operation such as at dedicated memory (DMEM0) 233. A conventional DMA copy operation would move information in SoC (130) memory to DMEM0 233 or to shared memory SMEM 235. The internal CBASS 248 is the network-on-chip for subsystem 200.

Internal CBASS 248 is 4-bytes wide. In at least one to access internal CBASS 248, a load and store operation must be performed, which is a high latency low throughput operation. However, using the tightly coupled and more direct transfer circuit 213 (283) reduces latency and overhead, while also providing greater bandwidth because of the broadside width of transfer circuit 213 (283). Thus, transfer, circuit 213 (283) can act as a direct map from register files to subsystem 200 memory (e.g., 233). Intermediate memory locations are bypassed and transfer circuit 213 (283) goes directly to a register file, which reduces latency.

As noted like AUX_PRU_0 205, PRU_0 219 also has accelerators. PRU_0 219 corresponds to PRU 116 of FIG. 1. As with PRU 116, PRU_0 219 has a task manager circuit 223. The primary difference between AUX_PRU_0 205 and PRU_0 219, is that PRU_0 219 interacts with interface circuit 104, receive circuit 105, transmission circuit 118 and interface circuit 119 (see FIG. 1), which are shown collectively in FIGS. 2A-C as interface circuit 225 (295). Interface circuit 225 (295) includes receive circuit 270 which includes level one FIFO transmit layer (TX_L1) 226 (296), and level two transmit layer (TX_L2) 262 (256) (see FIG. 1, 118). Transmit circuit 271 includes level one receiving layer (RX_L1) and level two receiving layer (RX_L2) 272 (257) (see 105, FIG. 1).

BS-RAM 214 (284) of PRU_0 219 of AUX_PRU 205 is the same as BS-RAM 204 (264). General purpose input/output (GPIO) circuit 215 (285) enables subsystem 200 to have access to additional hardwires of the SoC (e.g., 130, 246). Sigma-Delta circuit 216 (286) is an analog to digital converter which interacts with one or more external sensors (not shown). Sigma-Delta circuit 216 (286) converts a stream of analog data from the sensors to a stream of digital data. Sigma-Delta circuit 216 (286) is a filter. The data stream from the sensors corresponds to voltage or temperature at an external device such as a motor. Sigma-Delta circuit 216 (286) informs PRU_0 219 of certain events, for example if there is a spike in current, a spike in voltage, or a spike in temperature. PRU_0 219 determines what action, if any, needs to be taken because of the spike.

Peripheral interface 217 (287) is used for detecting a position or orientation of a device under control of subsystem 200, such as a motor or robotic joint. Peripheral interface 217 (287), for example, uses a protocol to determine the precise radial position of an arm. Sigma-Delta circuit 216 (286) and peripheral interface 217 (287) are thus used for device control, such as robotic control. Sigma-Delta circuit 216 (286) and peripheral interface 217 (287) are tightly coupled to the PRU_0 219, which enables subsystem 200 to be useful in industrial scenarios.

Packet streaming interface PSI 218 (288) of 219 is like PSI 211 (281) of 205 PSI. 211 (281) and PSI 218 (288) interact with navigation subsystem (NAVSS) PSI 210. However, while PSI 211 (281) has four receive (RX) inputs and one transmit (TX) output, PSI 218 (288) has a single transmit (TX) output. As noted, PRU_0 219 can move the register file of PRU_0 219 directly into the Ethernet wire (port) 253. Thus, a data packet enters through level one receiving layer (RX_L1) 227 of receive circuit 271 and level two receive layer (RX_L2) 272 (257) of receive circuit 271; there is no requirement to read memory or to go through DMA. Instead, the data packet can be immediately popped (pushed) to PRU_0 219 in a single data cycle. If necessary, the data packet can be pushed to level one transmit layer (TX_L1) 226 (296) or level two transmit layer (TX_L2) 262 (256) in the next clock cycle, which can be called a 'bridge-to-layer-cut-through' operation. In at least one a bridge-to-layer-cut-through operation is faster than a store and forward operation. The bridge-to-layer-cut-through operation can be performed while the data packet is pushed to the host 246 (for example, an SoC 130) via PRU_0 219 and port 245, or to slice_1 261, as the case dictates.

PRU_0 219 is a RISC CPU whose register file has access to an Ethernet buffer without the need to access or go through other memory. Interface 228 (298), interface 229 (299), and interface 230 (258) are physical media interfaces and include at least one RGMII. Real-time media independent interface 228 (298) is a 4-bit interface. Interface 229 (299) is a Giga-bit wide. Interface 229 (299) is a reduced Giga-bit media interface (RGMII). Interface 230 (258) is a serial Giga-bit media independent interface (SGMII). In one or more examples of these identified interfaces perform in real-time.

Ethernet interface circuit 225 (295) includes receive (RX) classifier circuit 232 (108) which takes rate data (107) and filter data (106) and other data, and based upon a predefined mapping function such as a time function, the classifier circuit 232 (108) classifies packets according to this mapping function. The packet's classification will determine the priority of the packet, which will dictate into which queue the packet will be placed (high priority queue, low priority queue, etc.). Port 253 of 225 (295) is essentially a wire dedicated to ethernet interface circuit 225 (295). Port 253 is at level zero of the OSI model. Interface 252 (255) is the interface between PRU_0 219 and ethernet interface circuit 225 (295). As noted, 270 (273) and 271 (274) are FIFO-configured circuits. FIFO transmit circuit 270 (273) corresponds to transmit circuit 118 of FIG. 1, and FIFO receive circuit 271 (274) corresponds to circuit 105 in FIG. 1. The classifier circuit 232 operates on data while the data is pushed into FIFO circuit 270 (273).

Slice_0 201 and slice_1 261 share a number resources 301, such as illustrated in FIG. 2B. Slice_0 201 and slice_1 261 are coupled to each other via internal CBASS 248. Internal CBASS 248 is coupled to interrupt controller 236. Interrupt controller 236 is an aggregator that aggregates instances of events (recall there are 196 possible events). Some of the events can come from the host (130) 246, though most of events are internal to subsystem 200. Because there are a large number possible events, events must be aggregated or consolidated into a smaller number of super-packets for sharing with the data from a host (e.g., 246) at large. Software running on PRU_0 219 determines the mapping of source to an output destination.

As noted, subsystem 200 includes internal configurable bus array subsystem (CBASS) 248 as a shared resource. Internal CBASS 248 receives data from external CBASS 247 via a 32-bit slave port. Internal CBASS 248 communicates with dedicated memory_0 233, dedicated memory_1 234, and shared memory (SMEM) 235 (115). SMEM 235 is a general-purpose memory. SMEM 235 can be used for direct memory access (DMA) operations, for DMA instruction sets, and other functions. DMA is like a scratchpad (126, 127), and can contain control and state information. Internal CBASS 248 also communicates with enhanced capture module (eCAP) 237, which also communicates with external configurable bus array subsystem (CBASS) 247. Enhanced capture module 237 is a timer used for time management an external device, such as a motor.

In at least subsystem 200 has different modes of operation. AUX_PRU_0 205 and PRU_0 219 each have a memory mapped register. The host 246 will write information to the configuration manager circuit 238. If, for example, the host 246 needs to enable RGMII mode, the configuration manager 238 will enable RGMII 229 (299), which is an example of a configuration register.

Universal asynchronous receiver-transmitter (UART) 239 is a hardware device for asynchronous serial communication in which the data format and transmission speeds are configurable. The electric signaling levels and methods are handled by a driver circuit external to the UART 239. UART must operate at a specific bod-rate, which requires a fixed clock rate. Asynchronous bridge (AVBUSP2P) 240 communicates with internal CBASS 248 and UART 239. UART 239, in turn, communicates with external CBASS 247. AVBUSP2P 240 is a bridge which allows for independent clocking of UART 239. External CBASS 247 is coupled to industrial Ethernet peripheral_0 (IEP0) 241A and industrial Ethernet peripheral_1 (IEP1) 241B. IEP0 241 and IEP1 273 each include a timer, an EDIO, and a WD (122). IEP0 241A and IEP1 241B jointly enable two time-domain managements to run concurrently. The like AP 237 timers search for timer of IEP0 and IIP2 must operate on a given frequency (for example 200 megahertz), but the PRU can be decoupled from these. Likewise, if necessary, AVBUSP2P 240, AVBUSP2P 242, and AVBUSP2P 243 are couplers which allow the UART 239, IEP0 241A and IEP1 241B to operate at different frequencies.

As shown in FIG. 2B, there is a second AVBUSP2P circuit 242 is communicatively interposed between IEP0 241A and internal configurable bus array subsystem (CBASS) 248. There is also a third AVBUSP2P 243 communicatively interposed between IEP1 241B and internal CBASS 248. The subsystem 200 also includes pulse-width modulator (PWM) 244, which is communicatively interposed between internal CBASS 248 and an external component.

Components 236, 237, 238, 239, 241A, 241B and 244 each connect to a specific SoC wire. That is, they each communicate with 1s of host 246.

FIG. 2B also shows that subsystem 200 can include spinlock 249, AUX_SPAD 250, and PRU_SPAD 275. Spinlock 249 is a hardware mechanism which provides synchronization between the various cores of subsystem 200 (for example, 205, 219) and the host 246. Conventionally, a spinlock is a lock which causes a thread trying to acquire it atomically to simply wait in a loop ("spin") while repeatedly checking if the lock is available. Since the thread remains active but is not performing a useful task, the use of such a lock is a kind of busy waiting. Once acquired, spinlocks will usually be held until they are explicitly released, although in some implementations they can be automatically released if the thread being waited on (that which holds the lock) blocks, or "goes to sleep". A lock is a synchronization mechanism for enforcing limits on access to a resource in an environment where there are many threads of execution. A lock enforces a mutual exclusion concurrency control policy. Based on this principle, spinlock 249 provides for automaticity for operations of subsystem 200 components. For example, spinlock 249 enables each of the subsystem's cores (e.g., AUX_PRU_0 205) to access a shared data structure, such as a data structure stored in SMEM 235, which ensures that the various cores are updated at the same time. The access of the various cores is serialized by spinlock 249.

As shown in the example subsystem 200, auxiliary scratchpad (PRU SPAD) 250 and AUX SPAD 275 each hold three banks of thirty 32-bit registers. Subsystem 200 also includes a filter data base (FDB) 251 (109), which comprises two 8 kilobyte banks and a filter data base control circuit. FDB 251 is a broadside RAM that is accessed by AUX_PRU_0 205 and PRU_0 219. FDB 251 is also accessible by the hardware engine Sigma-Delta 216 (286) and peripheral interface 217 (287). Receive circuit 271 (which includes level one receiving layer (RX_L1) 227 (297) and level two receiving layer (RX_L2) 272 (257) can also access FDB 251. FDB 251 is a broadside RAM with respect to AUX_PRU_0 205 and PRU_0 219 to read and write entries, but the hardware also uses FDB 251 to provide an accelerated compressed view of packets arriving through port 253. The hardware will consult memory of FDB 251 using a hash mechanism and deliver the result to PRU_0 219 along with the packet. Determining where the packet goes next is a routing function. AUX_PRU_0 205 and PRU_0 219 access FDB 251 via the broadside interface of FDB 251 to add information and to delete information. The receive hardware 225 (295) can also access FDB 251.

Subsystem 200 can also include communications interfaces 225 (295), such as a network communication circuit that could include a wired communication component and/or a wireless communications component, which can be communicatively coupled to processor 205. The network communication circuit 225 can utilize any of a variety of proprietary or standardized network protocols, such as Ethernet, TCP/IP, to name a few of many protocols, to effect communications between devices. Network communication circuits can also comprise one or more transceivers that utilize the Ethernet, power line communication Wi-Fi, cellular, and/or other communication methods.

As noted, in examples of this disclosure, data packets are processed in a real-time deterministic manner, unlike in conventional Ethernet or IEEE Ethernet processing, which defines more of a 'best efforts' traffic system in which packet loss occurs depending on the load of a given network. While conventional Ethernet management is acceptable for many applications, such as video streaming, in industrial settings, (for example, a robotic assembly line) sent data packets are (under ideal conditions) are delivered accurately and according to a predetermined schedule. In the industrial world packets must come according to a rigorous schedule. Of course, packet loss can occur in industrial environments but there are different means in layers (higher than level 0, level 1 and level 2 to which examples of this disclosure pertain) to take care of packet loss.

When a packet is received at level one receiving layer (RX_L1) 227 and/or level two receiving layer (RX_L2) 272 (257) from the physical layer (not shown), packet classifier 232 (108) analyzes the packet and identifies which portion of the packet is content (a/k/a 'payload'). The packet classifier (a/k/a 'packet classification engine') 232 then makes an on the fly decision regarding what to do with that packet. Ethernet bridge 225 (295) makes forwarding-and-receive decisions regarding each packet received (via receive circuit 271 and/or portal 253). In a conventional IEEE Ethernet bridge, such forwarding-and-receive operations are performed in a 'store and forward manner,' in which an incoming data packet is received in a first step, and once the data packet has been received, the content is then examined in a second step. In a conventional IEEE Ethernet bridge, once the packet is fully received and the content examined, a third step forwarding-and-receive determination is made. After the forwarding-and-receive determination is made, the data packet is then provided to a mechanical transmission layer, (such as via transmission element 226 (296). In at least one example of this disclosure, these steps are streamlined in a manner that minimizes latency and jitter. In at least one example, the classification engine 232 (260) is configured to perform the procedures of a conventional IEEE Ethernet bridge in an overlapping manner whereby by the time a packet has been completed received at 271(272) the classification engine 232 (260) has already determined what needs to be done with the packet, to what destination the packet needs to be sent, and by what route.

In examples of this disclosure, bridge delay is the amount of time between when a data packet arrives at a port 253 and goes out on another port 276. During the time between the ingress of the data packet and the egress of the data packet, there is, as noted the subsystem 200 makes a switching decision (determination) and then executes a transmit function. In the standard Ethernet IEEE world, the switching function is executed using a store and forward architecture which necessarily has a variable latency. Under variable latency conditions, there is no guarantee that when a data packet is received at time zero on the incoming port 253 (104, 105) that the data packet will go out at a fixed (known a priori) time on a different port (e.g., 276, 245). At least one benefit of subsystem 200 is that the classification engine 232 makes it possible to know that if a data packet is received at time zero, the packet will be sent out through another port (e.g., 245), within a predetermined (deterministic) period. In at least one example, this period is one microsecond. In at least one example, when a component, (such as slice_0 201), has such a short switching time, that component is deemed a real-time component, able to perform its assigned functions in 'real-time'. In examples of this disclosure, real-time computing (RTC) describes hardware and software systems subject to a "real-time constraint", for example from event to system response. For example, real-time programs must guarantee response within specified time constraints (a/k/a 'deadlines'). In some examples within this disclosure, real-time responses are in the order of milliseconds. In some examples within this disclosure, real-time responses are in the order microseconds.

Examples of this disclosure pertain to communication bridges which operate in real-time system. A communication bridge is a real-time control system in which input data and output data are exchanged in a deterministic manner. Examples of this disclosure include a control device (e.g., 217 (287), 244) and multiple slave devices (not shown) or devices (not shown) which consume the input/output data from the control device 217 (287), 244 in real-time. The real-time system 100, 200 has a communication bridge 255 real-time capability. Thus, the amount of time to forward packets is deterministic, with minimum jitter and latency. In at least one example, jitter and latency are minimized (to range of a few nanoseconds) by a hardware timer (not shown) which defines the time when a packet leaves a physical port 253, 252 (255). The real-time operability of subsystem 200 is different from standard Ethernet, in which jitter of at least tens of microseconds is common. In such conventional systems, the amount of time taken to make forwarding/routing determinations varies in accordance with when a packet arrives, the rate at which the data packet is received, and the content of the packet. In a real-time system (e.g., 200) of this disclosure, there is a cyclic execution of switching functions. For example, new data can be exchanged in the subsystem 200 every 31 microseconds. A predetermined exchange rate (such as 31 microseconds) serves as a time reference. Depending on when a packet comes in (via port 253, for example), the packet is either forwarded with the deterministic latency (in this example, 31 microseconds), or alternately, the data packet is handled according to a store and forward manner, like that described above for conventional systems. Thus, packet arrival time can be a discriminator for how a given data packet will be treated by the subsystem 200. Another factor taken into consideration by receive (RX) classifier 232 in determining what to do with an incoming packet is the data (transmit) rate normally associated with the type of packet in question. For example, if the average data rate of for a received packet if it exceeds a certain data rate threshold, the system can drop (less consequential) data packets to help ensure that there is enough bandwidth for higher priority packets. In at least one example, classifier 232 determines how important a given data packet is based, at least in part, on the packet's payload.

In at least one example, the classifier 232 examines packet content by first accessing a location in the packet, such as the packet's Ethernet media access control (MAC) address. A MAC address of a device is a unique identifier assigned to a network interface controller (NIC) for communications at the data link layer of a network segment. MAC addresses are used as a network address for most IEEE 802 network technologies, including Ethernet, Wi-Fi and Bluetooth. In at least one example, MAC addresses are used in the medium access control protocol sublayer of subsystem 200. In accordance with this disclosure MAC addresses are recognizable as six groups of two hexadecimal digits, separated by hyphens, colons, or using other notational systems.

Data packets can be filtered by filter 106 based on their designated delivery address (not shown). A data packet includes a six-byte source and destination address. In at least one example, interface circuit 225 (295) filters (106) packets based on that information. For example, interface circuit 225 (295) could read the packet's network address and determine whether to accept the packet, forward the packet or drop the packet. In at least on example, an accept-forward-drop decision can be based on a MAC header of the packet. In at least one example, in making an accept-forward-drop determination, an interface circuit can go further into the packet to the payload, and make filtering 106 determinations based on names which are in the payload. In some implementations of SoC 200, names of devices are connected in the payload, and then the content filter 106 looks at the payload.

In implementations of this disclosure, data packets will often contain multiple datagrams. This multiplicity of datagrams requires passing the packet, or portions thereof, to multiple addresses. Put another way, there can be multiple sub-packets in an Ethernet packet. Since the sub-packets can each have their own address, the addresses must be parsed. In situations where there are multiple addresses in one packet and the subsystem 200 will restart parsing each time a sub-address is detected. Thus, interface circuit 225 (295) will have a variable start offset for filters 106 to enable interface circuit 225 (295) to place multiple sub-packets in a single Ethernet packet. In at least one example, this means that sub-packets derived from a single data packet are sent to different devices (e.g., through peripheral interface 217 (287)); in examples of this disclosure, a single Ethernet packet can contain sub-packets, on or more of which are intended for (addressed to) different devices. Unless otherwise indicated, communications (packet exchange) of this disclosure are not point-to-point communications. Communications of this disclosure are based on a master device to slave device architecture. In implementations of this disclosure, a single master device (such as host 246 for example) controls tens, hundreds, or even thousands of slave devices.

Because of this asymmetrical relationship between master device and slaves, (1 to N, where N can be an extremely great number), and the requirement that communications occur in real-time, interface circuit 225 (295), which includes ingress filter hardware 106 is provided. The ingress filter 106, (and its attendant logic), in combination with ingress classifier 232 enables a hardware decision for real-time forwarding and processing. In examples of this disclosure, all of the information which must be read in order for a forward and receive determination to take place regarding a packet is located in the first 32 bytes in the packet. Once the first 32 bytes of that are read, PRU_0 219 can look up headers and additional headers, depending on the protocol with which the packet complies. The headers can be looked up (such as in filter data base 251) in real-time. Thus, once interface circuit 225 (295) has received the first 32 bytes of the packet, the interface circuit 225 (295) has sufficient information to determine whether to forward the packet, or whether to receive the packet, as described above. It should be noted that the 32-byte header size described is an example header size. Systems 100, 200 of this disclosure can be configured to work with packets that have other header sizes.

As noted, (packet) receive processing is done in real-time. In implementations of this disclosure, AUX_PRU_0 205, PRU_0 219, and interface circuit 225 (295) are programmable, and are configured such that all packet processing is completely deterministic. Receiving the 32 bytes of header information is done in interface circuit 225 (295) at a speed of 64 Giga-bit/second, which enables interface circuit 225 (295) to send 32 bytes of information forward or receive 32 bytes of information. The filters 106 of this disclosure are very flexible, insofar as they can be moved to filter a specific part of a packet. The filters 106 can be re-loaded by interface circuit 225 (295) as needed if there are multiple sub-packets. Additionally, interface circuit 225 (295) can apply a mask to set ranges of packets or addressees in packets and/or sub-packets. By grouping packets using greater than and less than operations, interface circuit 225 (295) can, for example, determine that when a packet has an address number from 15 to 29, that packet will be received. In some examples, binary masks can be applied, such that sub-packets having an address beginning with an even number, like 8-7, are forwarded, sub-packets having addresses beginning with odd numbers are not forwarded (at least not immediately). Thus, having a greater/less than operation for sub-packet address classification can be advantageous. In some examples, different filters such as 106 and 107 can be operationally combined with other components such as MAC 206 (266), 220 (290) to further process a packet by the packet's MAC address.

As noted, multiple filters can be combined for the interface circuit 225 (295) to make switching determinations. Additional logic can also be applied. For example, classifier 232 might classify a packet, and apply classification dependent logic, like 'for packet type A, if conditions one, two and three are true, then the packet will be received.' As another example, if a packet is classified as type B, if condition one is true and condition two is false, then the packet will be dropped. The subsystem 200 can be configured such that conditions can also include a time window in which a packet is received. For example, interface circuit 225 (295) could determine that at a certain point in time, the interface circuit 225 (295) will allow only very important (higher priority) input/output data to be forwarded. The interface circuit 225 (295) can be configured such that during a specified period (such as after a predetermined event has occurred), one set of filter combinations will be applied, whereas during other times all types of data traffic might be allowed. This described programmability is advantageous in industrial settings, as industrial communications operate based on hard time windows (in contrast to teleconferencing, for example.

In examples of this disclosure, multiple hardware filters can be combined with rate filters 107, such that data packets can be sorted according to rate as well. The filters 106, 107 and hardware 220 (290) operations used can be performed cumulatively. Packets can be filtered using any combination of content, time, and rate—all in real-time. A given filter 106 can be restarted multiple times for a packet. A filter 106 can have a start address whose value is determined, at least in part, on the content and/or type of content of a given packet/sub-packet.

In at least one example of this disclosure, interface circuit 225 (295) is configured to automatically detect whether a packet contains a virtual local area network (VLAN) tag. Some Ethernet packets have a tag for bytes of tag in the middle of a packet, or trailing a MAC address. It can occur that if a filter is applied to the data trailing the MAC address, the MAC address will be undesirably shifted by four bytes. Example interface circuits 225 (295) of this disclosure solve this problem by automatically detecting whether a packet has a VLAN tag, and if the packet does contain a VLAN tag, restarting the relevant filter 106 using the location of the VLAN tag as the start address. Thereafter, the interface circuit 225 (295) makes a determination, such as whether to receive or drop the packet using combinational logic, which can involve any appropriate combination of ANDs, ORs, and filter flags. In one or more examples of this disclosure, rate counters 107, which can be hardware rate counters, determines rates depending on the type of traffic in question and a predetermined time window for the packet's type. Thus, there can be a certain time for high-priority packets and a different time for non-real-time packets, and different filters can be applied depending on the situation. In some examples, filters 106 which yield immediate results during receive-time (on the fly) processing, will forward the packet in question regardless of the length of that packet. This operational capacity stands in stark contrast with that of conventional Ethernet, in which a packet is first received, one or more look up tables are consulted, and then a switching decision is finally made. In some examples of this disclosure, packet size is predetermined and communications occur at a fixed rate per packet. In other examples, information regarding packet length is contained within the header of the packet. In either case, packet length is determined in hard real-time on the fly.

At least one technical benefit of the architectures described in this disclosure is that they enable switching/forwarding determinations to be completed in a single microsecond, even for packets which have a length of up to twelve microseconds. The combinational logic of the interface circuit 225 (295) based on time, and data rate, enables the classification engine 232 to perform in a robust fashion. The ability of the subsystem 200 to restart a filter 106 to apply the filter 106 multiple times in a packet enhances the ability of the subsystem 200 to make packet switching decisions in real-time. In an example implementation, filter 106 which is limited in length. If a packet is longer than the filter, the filter 106 will need to be reloaded. If an Ethernet packet which contains sub-packets a filter 106 can be reused for multiple locations with the single packet. In some examples, sub-packets will each have their own address. If for example, a packet contains three subpackets, an address filter 106 can be loaded three times to apply the same address filter 106 to each sub-packet. PRU_0 219 writes data into TX_L2 via interface 252 (255), and the data then exits slice_0 201 along communications pathway 253. The real-time processing described supports the resource availability and allocation management which is described below.

As noted, aspects of this disclosure and components of the ICSS 200 pertain to motor control. Motor control signals can be communicated using application site communications. In industrial settings, devices and components can communicate input/output data between one another in accordance with one or more ethernet protocols. In the case of motor drives and motor controls, there is always an application side to this input/output data. Motors can be driven by multiple pulse-width modulated signals. Pulse-width modulation is used in controlling motor applications in such contexts as robotics, machine tools, and conveyor belts. Proper pulse-width modulation of mechanical devices like these is an important factor in maintaining safe operations in places like factories and work sites. One aspect of safety is device error mitigation. Another aspect of safety is device error minimization. One way of mitigating and minimizing device errors is to understand the causes and effects of past errors. One or more examples of this disclosure are directed to identifying and tracking the sources of errors (sometimes called 'glitches') and tracking when glitches occur. Examples of this disclosure include systems and methods for safely controlling pulse-wide modulation driven devices (such as motors) in the presence of glitches, thereby mitigating any harm that might be caused by such glitches.

As noted, pulse-width modulators (such as PWM 244 in FIG. 2B) control motors. In examples of this disclosure, PWMs control motors by using pulse-width modulated signals to drive motors at a certain speed and a certain torque. In industrial applications, typically there are six pulse-width modulation signals are used to drive a three-phase electrical machine (such as three-phase motor). Additionally, there is a signal called a trip signal which is sent to a PWM to cause the PWM to shut down a motor power stage. As previously explained, pulse-width modulation signals are translated into high power signals to drive high power motors. A trip signal can come from a control unit to a power unit, such as a PWM.

One way to enhance safety in environments that involve industrial applications such as robots, server drives, computer numerical control (CNC) is to be able to quickly (and safely) turn off the power stage of such applications. An example of a power stage within this disclosure is metal oxide field effect transformer (MOSFET) insulated-gate bipolar transistor (IGBT) and other electronics which drive motors.

A duty cycle or power cycle is the fraction of one period (T) in which a signal or system is active. A period is the time it takes for a signal to complete an on-and-off cycle. A duty cycle (D) is the ratio of a pulse-width (PW) (pulse active time) to the period (T). A duty cycle (D) can be defined according to the formula: $D=PW/T$. The nature of the duty cycle of a PWM means that for three-phase motors, up to six of those pulse-width modulation signals are necessary for control. Within this disclosure, a trip signal is a signal that is sent by a pulse-width modulator 244 to shut off the power stage in case of an error condition.

There many conditions in which it may be necessary to stop the power generation hardware. A trip signal indicates that such a condition exists. For example, there can be a failing condition in the power stage itself, such as a short circuit. A trip signal can be uttered because the temperature in a component is too high temperature, or there is too much current flowing. A trip signal can be uttered because one or more motors is in an incorrect position, or because a motor is running at the wrong speed.

In some industrial environments there can be large amounts of electromagnetic disturbance, which can affect the signal output of electronics. The alterations in signal outputs can be interpreted as indicating that there are glitches and errors in the components from which the signal outputs came. Sometimes this can cause false positives in error detection. Moreover, not all error detections necessarily require a power stage shutdown. As will be described in greater detail below, examples of this disclosure include systems and methods for filtering glitch-indicating signals. In some examples, glitch-filtering is performed by one or more logic blocks configured to discriminate between PTOS which necessitate power stage shut down and those PTOS which do not necessitate power stage shut down. In some examples combining multiple PTOS into a single PTOS is an aspect of glitch filtering.

Aspects of this disclosure pertain to capturing data for diagnostic purposes. For example, if a failing condition (glitch) is detected once for a component, it may be appropriate to ignore the failing condition, whereas if the same failing condition was detected three times in quick succession, it may be appropriate to investigate the cause of the glitch. In one or more examples of this disclosure, PTOS are logged and summarized. The PTOS data, which comes from different information sources, is fed to the glitch filter (which can be a state machine) in such a way as to improve the operational accuracy of the glitch filter over time. In some instances, the filter logic can be reprogrammed based on the described glitch analytics. In some examples, glitch data is analyzed and fed back to the glitch filter in real-time.

Signals between a PWM and a motor which is being driven by that PWM are motor-side communications. Motor-side communication is done in accordance with a motor-side communication protocol which is not an ethernet protocol. Motor-side communication is serial based, but it is a real-time communication of position data to a control unit, and then motor current, these are bit streams typically from analog-to-digital computers which use a delta sigma method 216, in which data concerning electrical current values is contained within bit streams. Some motor-side communication is protocol-based communication, like positional feedback signals, whereas others like motor current are sent in bit streams. A pulse-width modulation signal is an example of a digital control signal.

In at least one example of this disclosure, a filter state machine receives signals indicating one or more events have occurred. A filter state machine can have a static trip configuration or a dynamic trip configuration. A filter operating in a static configuration (or mode) will issue a trip signal when a certain event (such as a glitch) is detected. A filter state machine operation in a dynamic mode can detect patterns in events. For example, a dynamically configured filter might issue a trip signal if the same error is detected multiple times (depending on the seriousness of the error) in a certain period.

In at least one example of this disclosure, a glitch filter can be programmed to issue a trip event indication signal (TEIS) depending on what event(s) signals the filter receives. Signals (412A, 422) which are input to a glitch filter (412, 417) by a logic block (414) or amplifier (417A) or other components, can suffer impulse noise, in which a signal switches briefly from one state to another and then back. For example, from inactive to active, and then quickly back to inactive. The glitch filter (412, 417) will remove the short-term state changes in an inactive input signal (for example, low) and ensure the output signals from the filter remain remains inactive (do not switch to the incoming state), provided the active input signal is within a predefined glitch width.

In one or more examples, a glitch filter has an active state and reset state. When an ICSS 200 is powered up the components of the ICSS need to go into a defined reset state. After the reset state, a component, such as a motor application can enter an active state. The timing of the reset state is controlled a state machine. A state machine (421) can be programmed for one shot detection. When programmed for one shot detection, once the state machine (421) determines that a trip signal-worthy event or combination of events has occurred, (insofar as the state machine receives a valid and unmasked (active) trip input (411-420)), and outputs a trip signal (goes to a predefined value, goes active) as a result, the output signal (408) will remain active (also known as 'latched'), even if the input trip signals return to an inactive state.

A state machine can be programmed such that detection and trip output settings are reset with the cycle time of the period of a motor control cycle. In such a cycle-by-cycle mode, the trip signal (408) will end and the PWM (244) will resume normal operation when the input (411-420) disappears. The one-shot detection helps to ensure that the power stage turns fully turned off and the motor current goes to zero, (until externally reset, much as manually). One shot detection is more appropriate to critical fault conditions like a short-circuit detection or a position error fault. Note that in some examples, the state machine (421) can be configured to handle some trip inputs in a one-shot manner, while for other trip inputs the state machine will stop issuing a trip signal (408) when these other inputs go inactive in a next cycle. An ICSS can thus be tailored to the needs of the user. In some embodiments, a state machine can scan for glitch signals in one or more multiples of 31.25 microseconds. In at least one embodiment, a glitch filter scans for glitch signals at a rate of 60 kilohertz. In at least one embodiment, a glitch filter scans for glitch signals at a rate of 80 kilohertz.

Unlike in conventional systems, the ICSS 200 manages protection sources and all aspects pulse-width modulated power controls. In one or more embodiments, the glitch filter components of the ICSS 200 are highly customizable because they are programmable and configurable to operate in varying environments. Despite the glitch filter's versatility and programmability, the glitch filter also has low latency. In one or more examples, information is moved through the ICSS 200 in five nanosecond intervals. In some examples, position information (regarding external devices such as motors) is communicated through one or more communication interfaces (270, 271, and 272 in FIG. 2B, for example). Such position information can be real-time information. In some examples, as position information is received in real-time, if that position information indicates that there is an error, the information concerning a positioning error is transmitted to a hardware state machine. If the hardware state machine is configured for example, to trigger on positional errors, hardware state machine would immediately output a trip signal. In at least one example of the ICSS 200, there is a combination of a hardware state machine and computational logic which resides in a real-time processing and communication domain of the ICSS 200. This arrangement differs from conventional solutions in which communications concerning control functions are controlled by an external ASIC or SPGA and in which information concerning control functions are communicated to a control PRU through an interface.

In at least one example of this disclosure, low latency in the ICSS 200 is enhanced by the integration of all trip inputs to one hardware device. Management of all trip inputs occurs in a single hardware state machine (421).

Figure 3:
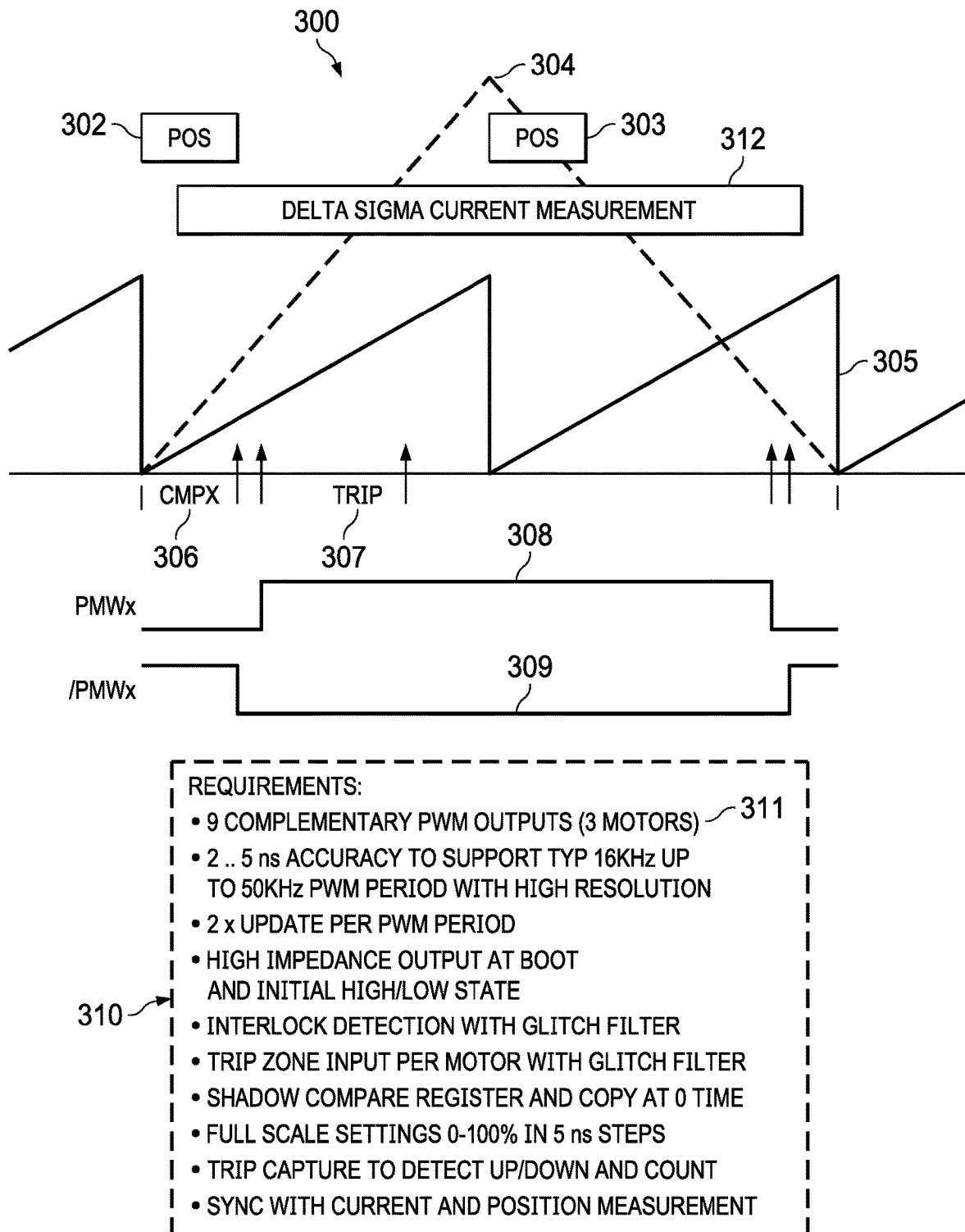
FIG. 3 illustrates aspects of pulse-width generation in accordance with an example of this disclosure.

FIG. 3 illustrates aspects of pulse-width generation 301 in accordance with an example of this disclosure. In the example shown in FIG. 3, nine complimentary pulse-width modulation outputs are matched to three motors 311. Pulse-width modulation signal 308 and pulse-width modulation signal 309 are generated by pulse-width modulator (PWM) 244. The 'x' suffix in the 'PWMx' indicator (308) and '/PWMx' indicator (309) reflects that fact that there are more than one pair of pulse-width modulation signals (272) are used to drive a three-phase motor, for example. Control signal 305 and comparator signal 306 are generated by IEP0 241. Control signal 305 and comparator signal 306 go to the PWM 244. Also shown is trip output signal 307 (425), which goes to PWM 244 when certain types of events occur, as will be explained in greater detail in the discussion of FIG. 4A and FIG. 4B. Control signal 305, and pulse-width modulation signal 308 and pulse-width modulation signal 309 are generated by PWM 244. Positional event indicator 302 is an indication that an error event has occurred. Positional event indicator 303 is an indication that another error event has occurred. PRU 219 and peripheral interface 217 form a feedback system which tracks position data of a motor and generate trip event indication signal number five (420) when a positional error is detected. Sawtooth signal 305 is output from compare0 register (402). The period 304 of signal 305 is also shown in FIG. 3. Trip event indicator 307 indicates that external output pin 432 has sent a signal (TEIS-2) indicating trip event-2 has occurred. Pin 432 connects to PWM 244. The delta sigma current measurement 312 is generated by SigDelta 216 and PRU of FIG. 2.

Figure 4A:
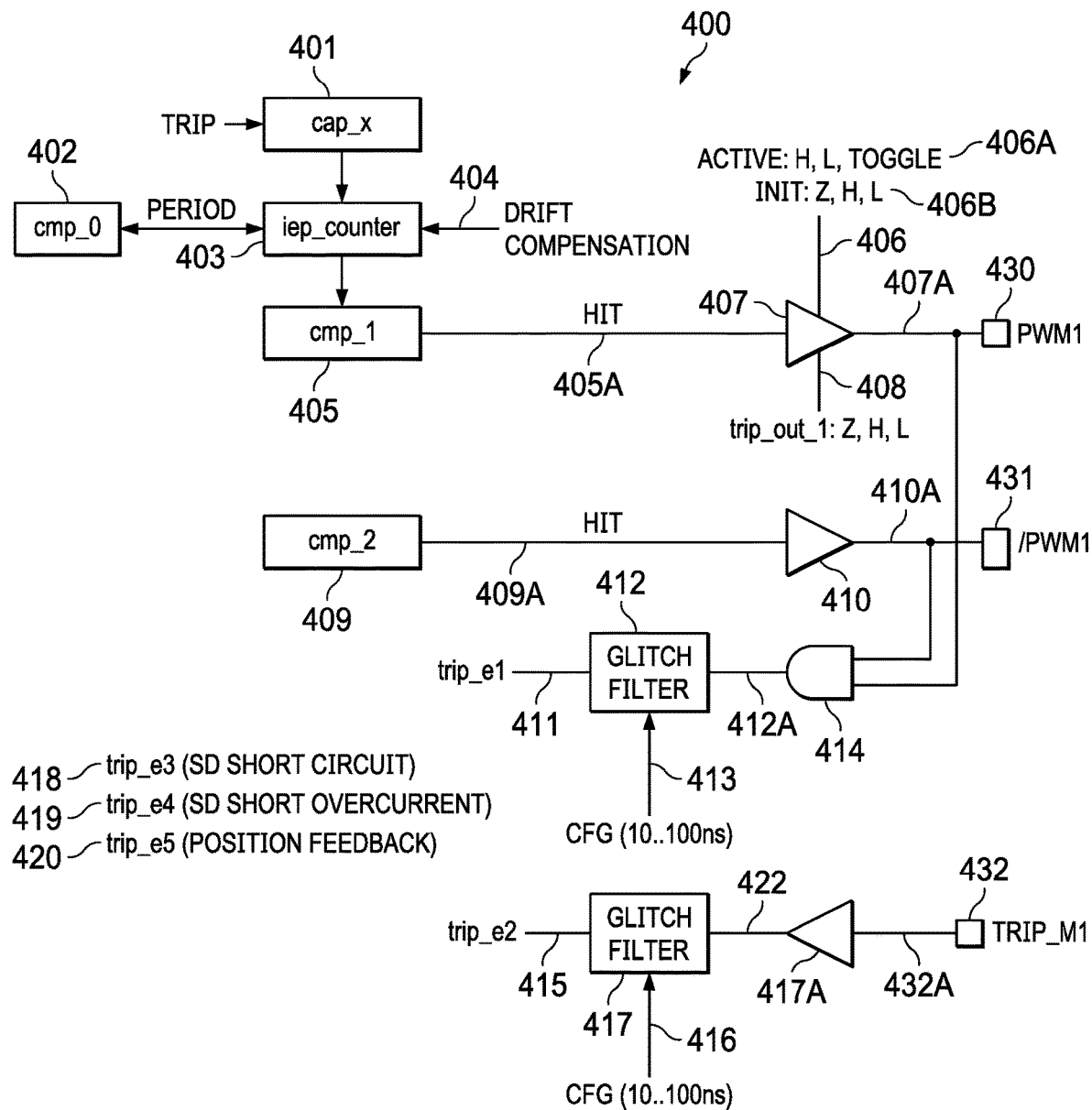
FIG. 4A illustrates a logic configuration of a pulse-width modulation monitor and controller, in accordance with an example of this disclosure.
Figure 4B:
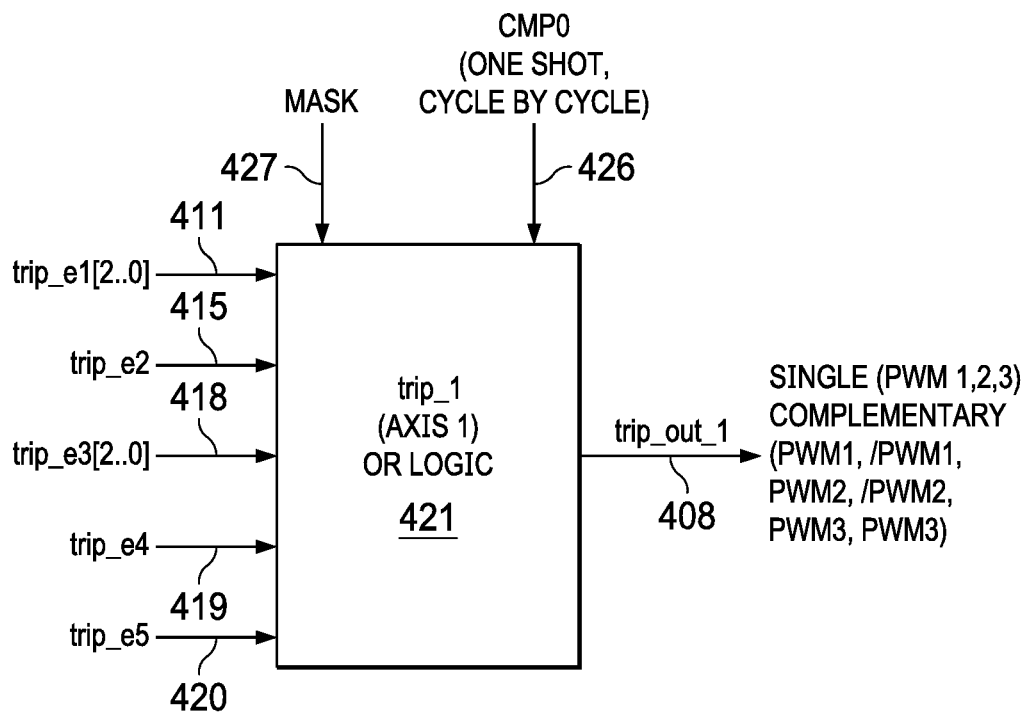
FIG. 4B illustrates a trip-signal logic unit which interacts with the logic configuration illustrated in FIG. 4A, in accordance with an example of this disclosure.

FIG. 4A illustrates a logic configuration 400 of a pulse-width modulation monitor and controller of an example ICSS (200). FIG. 4B illustrates a trip-signal logic circuit 421 of the ICSS (200) which interacts with logic configuration 400. As shown in FIG. 4B, and as discussed above, each trip-signal logic circuit 421 can generate a single trip output signal 425. The value of selector signal 426 dictates whether trip-signal logic circuit 421 operates in a one-shot mode or alternately in a cycle-by-cycle mode, as explained above. In the example illustrated in FIG. 4B, trip-signal logic circuit 421 is configured to track five trip input signals, each corresponding to a trip event.

Gate 414, shown in FIG. 4A monitors PWM output signal 308 of PWM terminal 430 and PWM output signal 309 of PWM terminal 431. If signal 308 and signal 309 are both active (high), gate 414 outputs event indication signal number one (EIS-1) 412A to glitch filter 412. Depending on how glitch filter is configured, when glitch filter 412 receives EIS-1 412A, glitch filter 412 will send trip event indication signal number one (TEIS-1) 411 to trip-signal logic circuit 421. As noted, the PWM (244) generates nine complementary pulse-width modulation outputs for each grouping of three motors. TEIS-1 411, based on EIS 412A from gate 414 monitors the pulse-width modulation signals generated by the PWM (244) to ensure that the pulse-width modulation signals 308, 309 complement each other (are in phase, do not activate two transistors at the same time, etc.). Glitch filter 412 can be configured using configuration memory-mapped register 413 to filter or block EIS-1 412A from gate 414 which do not satisfy a certain threshold, such as when the trip signal is too short-lived. Glitches such as these are reflected in small peaks of ones or zeros, typically caused by an external electromagnetic disturbance.

Event indication signal number two (EIS-2) 432A (shown in FIG. 4A) corresponds to a signal coming from an external source 432. For example, an external power board could be configured to send EIS-2 432A if the temperature of the power board exceeds a certain threshold. As is the case for TEIS-1 411, interposed between the external source 432 and the input 415A for TEIS-2 415 (corresponding to trip event-2) there is a glitch filter 417 which is configurable 416 to filter error signals (such as EIS-2 432A) which are indicative of false positives. Glitch filter 417 will only send a trip event indication signal (TEIS-2) 415 to trip-signal logic circuit 421 if EIS-2 432A coming from external source 432 satisfies certain customizable criteria. In practice, filters 412 and 417 will be programmed based on the needs of the environment in which the ICSS (200) is operating. For example, if signal errors such as jitter or ringing occur in a robot arm is being used to spray paint such signal errors are more likely to be indicative of a true fault than if they occur in a welding environment in which electromagnetic disturbances are not uncommon. The programmability of the filters 412, 417 allows the sensitivity of error detection in the ICSS to be finely tuned. Trip event indication signal number three 418 indicates that sigma delta (216) has detected a short circuit. Trip event indication signal number four 419 indicates that an overcurrent has been detected in (for example) one or more motors being controlled by the ICSS (200). Trip event indication signal number five (TEIS-5) 420 is based on feedback received (using a serial-based protocol) by PRU 219. If the PRU determines that an external component controlled by the ICSS (200) is in an incorrect position, then the PRU 219 will send TEIS-5 420 to trip-signal logic circuit 421. Trip-signal logic circuit 421 is configurable 427 to mask one or more trip input signals, meaning that trip-signal logic circuit 421 can be configured to send a trip output signal 425, such as would cause a motor to shut down, only for desired combinations of trip events.

Trip capture block 401, comparator0 403, counter 403, drift compensation input 404, comparator1 405, and comparator2 409, illustrated in FIG. 4A are components of IEP0 (241). Hit signal 405A is sent from comparator 405 of IEP0 241 to input PWM1 of PWM 244. Output buffer 307 is interposed between IEP0 and PWM 244. Buffer toggle 306, output buffer 307, buffer 410, glitch filter 412, configuration input 413, gate 414, trip event two input 415A, glitch filter configuration input 416, buffer 417, and trip-signal logic circuit 421 are components of PWM 244. Output pin 430 and output pin 431 are output pins of PWM 244. Signal 308 emanates from output pin 430 and signal 309 emanates from output pin 431. Comparator1 405 compares its programmed value (cmp_1), with the value (IEP_counter) in counter 403. If the value in comparator1 405 equals the value in in counter 403, comparator1 will issue a hit signal 405A.

In at least one embodiment, when comparator1 405 sends a hit signal 405A (see 306 of FIG. 3) to PWM 244, it creates a rising edge in signal 308. Similarly, when comparator2 409 sends hit signal 409A to PWM 244, it creates a rising edge in signal 309. IEP counter 403 counts errors and the number of errors detected is represented by the rising edge of sawtooth waveform 305. Like comparator1 405, comparator2 409 compares its programmed period value (cmp_0) with the value (iep_counter) in IEP counter 403. When the number of errors in the IEP counter 403 reaches the value in comparator 402, the IEP counter 403 gets reset to zero. (if the values in comparator2 409 and IEP counter 403 are the same, the value of IEP counter 403 is reset to zero.)

In at least one example of this disclosure it is beneficial for the pulse-width modulation signal from PWM 244 to be synchronized with other periods, such as communication cycles. As shown in FIG. A, drift compensation 404 is used to shift the output signal 308, 309 from PWM 244 to keep it in phase with other components, such as an external clock. PWM 244 has an active mode 406A and an initialization mode 406B; input 406 selects the operational mode 406A, 406B of PWM 244. During the initialization mode 406B, the pulse-width modulation output signal 272 is set to high impedance H or low impedance L. If PWM 244 receives a hit signal 405A at input buffer 407 when PWM 244 is in the active mode 406A, the PWM 244 will output 272 a high impedance signal H or a low impedance signal L or toggle the output 430 (272) from one (current) output signal (H or L) to the other, depending on how input buffer 407 is programmed. In one or more examples, input buffer 407 can be reprogrammed easily according to the needs of the user and/or the environment in which the ICSS 200 is operating. Trip signal 408 is emitted by trip-signal logic circuit 421 (when a trip condition is determined by trip-signal logic circuit 421) and enters input buffer 407 as shown. When PWM 244 is in an active mode 406A, trip signal 408 will cause the output 430 of PWM 244 to be high impedance (Z), high (H) or a low (L), depending on how buffer 407 is configured. The trip signal 408 will overrule hit signal 405A. Comparator-2 409 serves the same function as comparator-1, but for the negated pulse-width modulation signal 241. Comparator-2 409 of IEP0 241, when warranted, sends hit signal 409A to filter 410 which depending on the settings of filter 410, will output the hit signal 409A to output 431 of PWM 244 via signal 410A. Signal 410A also goes to gate 414. If both signals 410A and 407A are active, gate 414 will generate an EIS at 412, which will trigger a TEIS 411 at glitch filter 412, which will cause the trip logic 421 to issue a trip signal 408, which will in turn put the PWM (244) into an inactive state. The condition that both (complementary) PWM signals PWM1 and/PWM1 are active is catastrophic, since it would turn on both the high-side and low-side power switch in the power stage and generate a short-circuit therein. This condition is called shoot-through, which should be avoided because of the possible damage or harm that can result from a short-circuit in the power stage.

Filter 410 is controlled by a state machine (421), as will be explained in greater detail below. During a first state (initialization) of filter 410, signal 410A is an initialization signal, during a second (active) state signal 410A corresponds to hit signal 409A, and during a third (error) state, signal 410A gets set in accordance with trip signal 408.

TEIS-1 411 corresponds to an error condition in which the output signal 308 from PWM 244 terminal 430 and the output signal 309 from PWM 244 are both active (high). If the output signal 308 from PWM 244 terminal 430 and the output signal 309 from PWM 244 are both in an active state (for example, are both high), the power stage of a motor being driven by PWM 244 can be damaged (by a short). Gate 414 which monitors PWM output terminal 430 and PWM output terminal 431. If gate 414 determines that PWM output terminal 430 and PWM output terminal 431 have the same high output, meaning trip event one has occurred, in which case gate 414 sends EIS-1 412A to glitch filter 412. (When signal 308 and signal 309 are both low, that is not an error condition.) If glitch filter 412 determines that EIS-1 412A corresponds to a true error or fault condition, rather than a glitch, glitch filter 412 of FIG. 4A will send TEIS-1 411 to trip-signal logic circuit 421 of FIG. 4B.

Filter 412 can be configured (for example) to ignore EIS-1 412A when EIS-1 412A falls below a threshold. For example, in a robotics and machine environment, if there is a miniscule trip, it can be due to an electromagnetic disturbance in the environment (a glitch), rather than a true error condition which warrants turning off a power stage of a device being driven by PWM 244. Again, the sensitivity of PWM 244 to glitches can be adjusted by configuring glitch filter 412 (and glitch filter 417). Glitch filter 412 is configurable 413 to mask (or screen) EIS-1 412A which are shorter than a threshold period; the threshold period can be set to ten nanoseconds or 100 nanoseconds, as well as any period between 10 nanoseconds and 100 nanoseconds. Configuration memory-mapped register stores the threshold value for glitch filter 412. Glitch filter 417 is configurable using configuration memory-mapped register 416 to mask (or screen) event indication signals (such as EIS-2 432A) which are shorter than a threshold period; the threshold period can be set to ten nanoseconds or 100 nanoseconds, as well as any period between 10 nanoseconds and 100 nanoseconds. Configuration memory-mapped register 416 stores the threshold value for glitch filter 417.

In at least one example, trip-signal logic circuit 421 can receive five trip signals. TEIS-1 411 comes from glitch filter 412 and indicates that the output terminals 430, 431 of a PWM 244 are high at the same time. The trip event-1 input 411a bears the indicia '[2 . . . 0]' because three-phase motor is driven by three pairs of pulse-width modulation signals 308, 309, 430, 431. Trip event indication signal number two 415 indicates there is a fault in an external component 432. Trip event indication signal number three 418 comes from PRU 219 and sigma-delta accelerator 216 and indicates there is a short circuit in the SoC 246 of which ICSS 200 is a component. Trip event indication signal number four 419 comes from PRU 219 and sigma-delta accelerator 216 and indicates there is an overcurrent in the SoC 246 of which ICSS 200 is a component. Trip event indication signal five 420 comes from PRU 219 and peripheral interface 217 and can indicate that a device being controlled by ICSS 200 is in an incorrect position. Mask input 427 and compare-0 input 426 are used to configure trip-signal logic circuit 421.

FIG. 5 illustrates aspects of a system 500 in accordance with an example of this disclosure. Block 501 highlights aspects of FIGS. 2A-C. Control PRU-1 502 corresponds to PRU 215 of FIG. 2A. Interface PRU-1 503 corresponds to PRU 219 of FIG. 2A. Control PRU-2 504 corresponds to PRU 265 of FIG. 2C. Interface PRU-2 503 corresponds to PRU 289 of FIG. 2C. IEP timer-1 506 corresponds to IEP0 241 of FIG. 2B. IEP timer-2 corresponds to IEP1 273 of FIG. 2B. System 500 (200) includes four multiplication units 508. System 500 includes combinations 509 of broadside random access memory and trigonometric lookup tables. Task manager 510 corresponds task managers 209 and 223 of FIG. 2A and task managers 269 and 293 of FIG. 2C. Interrupt controller 511 corresponds to interrupt controller 236 of FIG. 2B. PWM block-1 512 and PWM block-2 513 illustrate the fact ICSS 200 comprises multiple pulse-width modulators like PWM 244 of FIG. 2B. Delta-sigma block 514 illustrates the fact that PRU 219 and accelerator 216 are capable of generating nine sigma-delta signals (418, 419). Delta-sigma block 513 illustrates the fact that PRU 219 and accelerator 216 of FIG. 2A are each capable of generating nine sigma-delta error signals (418, 419). Delta-sigma block 514 illustrates the fact that PRU 265 and accelerator 286 of FIG. 2C are each also capable of generating nine sigma-delta error signals (418, 419). Encoder block 516 illustrates that peripheral interface 217 utilizes three encoders for motor position measurement. Likewise, encoder block 517 illustrates that peripheral interface 287 utilizes three encoders for motor position measurement.

Figure 6:
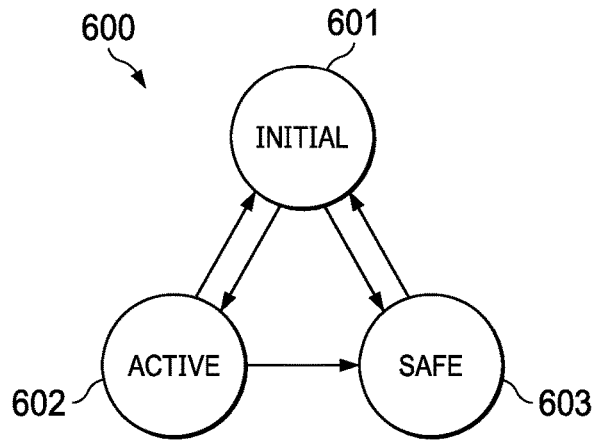
FIG. 6 is a state diagram showing a relationship of possible states of one or more components of a system such as those illustrated in FIG. 1 and FIGS. 2A-C, in accordance with an example of this disclosure.

FIG. 6 is a state diagram 600 showing the relationship of the possible states of buffer 407 of FIG. 4A. Upon powering up buffer 407 goes into initialization state 601. When buffer 407 is in the initialization state 601, the output 407A of buffer 407 can be high impedance (Z), high (H), or low (L). After initialization 601 of buffer 407 is complete, buffer 407 can enter an active (operational) state 602. When buffer 407 is in the active state 602, if buffer 407 receives a hit signal 405A, the hit signal 405A will cause the output 407A of buffer 407 to be high (H), low (L), or hit signal 405A will cause the value of output signal 407A to be toggled, (if output 407A is high, output 407A will switch to low; if output 407A is low, output 407A will switch to high). Whether buffer 407 is in the initialization state 601 or in the active state 602, when buffer 407A receives a trip signal 408, the buffer will be placed into safe mode 603. In safe mode, the value of output signal 407A will be high impedance (Z), high (H) or low (L) depending on how buffer 407 is programmed. Note again that buffer 407 is reconfigurable based on the needs of the user.

Figure 7:
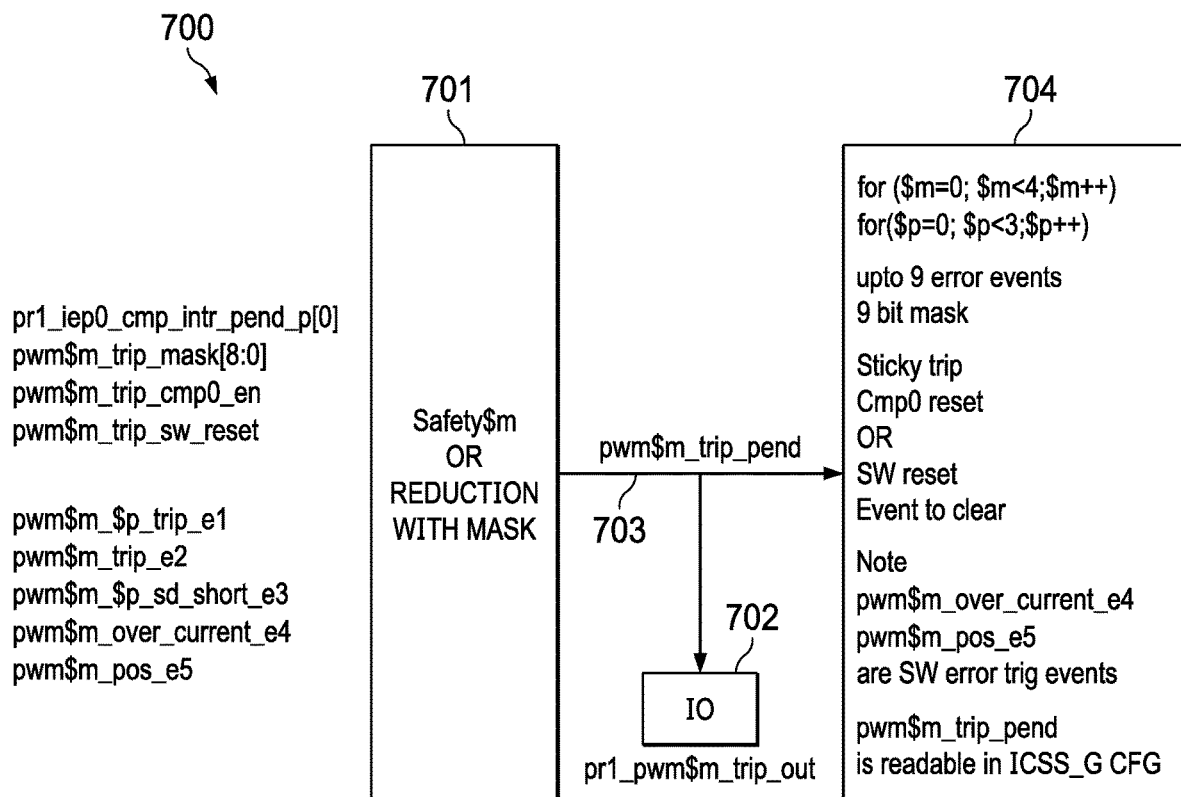
FIG. 7 is a block diagram of a state machine 700, in accordance with an example of this disclosure.

FIG. 7 is a block diagram of a state machine 700 (421), in accordance with an example of this disclosure. In FIG. 7, block 701 represents the inputs (411-420) of the state machine (421) the trip inputs are analyzed by state machine 700 and cause state machine 700 to send trip signal 703 to input-output port 702 which includes buffer 407 and output terminal 430 of PWM 244. Block 704 illustrates configurable logic of the state machine 700 which determines how the state machine 700 will treat an existing trip signal 703 depending on whether the state machine 700 is in a one-shot mode or a cycle-by-cycle mode, as previously described.

While an SoC is primarily used throughout the above disclosure as an example type of chip, it will be appreciated that the techniques described herein may be applied in designing other types of IC chips. For instance, such IC chips may include a general-purpose or application-specific (ASIC) processor based upon x86, RISC, or other architectures, field-programmable gate array (FPGA), graphics processor (GPU), digital signal processor (DSP), a system-on-chip (SoC) processor, microcontroller, and/or related chip sets.

Certain terms have been used throughout this description and the claims to refer to particular system components. As one skilled in the art should appreciate, different parts may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. A device comprising:
   a controller that includes:
      a set of inputs to receive a set of event indication signals associated with operation of a motor;
      a set of glitch filters coupled to the set of inputs such that each glitch filter of the set of glitch filters is configured to produce a respective trip signal of a set of trip signals in response to a respective event indication signal of the set of event indication signals; and
      a logic circuit coupled to the set of glitch filters to receive the set of trip signals and configured to provide a trip output signal configured to inactivate the operation of the motor in response to the set of trip signals; and
   a pulse width modulator coupled to the controller, wherein the pulse width modulator includes:
      a set of outputs to provide a set of complimentary signals configured to control operation of the motor, wherein the set of outputs are coupled to a subset of the set of inputs of the controller; and
      an input coupled to the logic circuit to receive the trip output signal.

2. The device of claim 1, wherein the pulse width modulator is configured to inactivate the set of complimentary signals in response to the trip output signal.

3. The device of claim 1 further comprising a power stage that includes:
   a set of inputs coupled to the set of outputs of the pulse width modulator to receive the set of complimentary signals; and
   an output configured to couple to the motor to control the operation of the motor in response to the set of complimentary signals.

4. The device of claim 1, wherein:
the logic circuit is a first logic circuit;
the controller includes a second logic circuit coupled to the subset of the set of inputs of the controller to receive the set of complimentary signals; and
the second logic circuit is configured to assert a first event indication signal of the set of event indication signals in response to each signal of the set of complimentary signals being asserted concurrently.

5. The device of claim 1, wherein the set of event indication signals includes at least one of: a processor event signal, a short-circuit event signal, an overcurrent event signal, or a positional error event signal.

6. The device of claim 1, wherein:
the logic circuit includes an input to receive a mask; and
the logic circuit is configured to mask off a first subset of the set of trip signals based on the mask such that the trip output signal is provided in response to a second subset the set of trip signals.

7. The device of claim 1, wherein the logic circuit includes an input to receive a control signal; and
the logic circuit is configured to select, based on the control signal, between asserting the trip output signal until a reset signal is received or asserting the trip output signal until a change in the set of trip signals occurs.

8. The device of claim 7, wherein the logic circuit is configured to select, based on the control signal, to:
assert the trip output signal in response to a first subset of the set of trip signals until a reset signal is received; and
assert the trip output signal in response to a second subset of the set of trip signals until a change in the second subset of the set of trip signals occurs.

9. The device of claim 1, wherein each glitch filter of the set of glitch filters includes a configuration input to receive a filter threshold.

10. The device of claim 9, wherein each glitch filter of the set of glitch filters is configured to compare a duration during which the respective event indication signal is asserted against the respective filter threshold to determine whether to assert the respective trip signal.

11. A method comprising:
receiving a mask;
receiving, by a controller, a set of event indication signals associated with operation of a motor;
for each event signal of the set of event indication signals, applying a glitch filter to the respective event signal to produce a respective trip signal of a set of trip signals;
masking off a first subset of the set of trip signals by the controller; and
based on the mask, providing, by the controller, a trip output signal in response to a second subset of the set of trip signals of the set of trip signals that does not include the first subset, wherein the trip output signal is configured to inactive the operation of the motor.

12. The method of claim 11 further comprising:
receiving from a pulse width modulator a set of complimentary signals associated with a phase of the motor;
detecting whether the set of complimentary signals are asserted concurrently; and
determining whether to assert a first event indication signal of the set of event indication signals based on whether the set of complimentary signals are asserted concurrently.

13. The method of claim 12, further comprising determining whether to inactive the set of complimentary signals based on the trip output signal.

14. The method of claim 11, wherein the set of event indication signals includes at least one of: a processor event signal, a short-circuit event signal, an overcurrent event signal, or a positional error event signal.

15. The method of claim 11 further comprising:
receiving a control signal; and
determining based on the control signal whether to assert the trip output signal until a reset signal is received or assert the trip output signal until a change in the set of trip signals occurs.

16. The method of claim 15, wherein the control signal specifies to assert the trip output signal until the reset signal is received for a third subset of the set of trip signals and to assert the trip output signal until the change in the set of trip signals occurs for a fourth subset of the set of trip signals.

17. The method of claim 11, wherein the applying the glitch filter to the respective event signal to produce the respective trip signal includes applying an independent threshold to the respective event signal.

18. The method of claim 17, wherein the independent threshold of each glitch filter is between 10 and 100 ns.

19. A device comprising:
a controller that includes:
a set of inputs to receive a set of event indication signals associated with operation of a motor;
a set of glitch filters coupled to the set of inputs such that each glitch filter of the set of glitch filters is configured to produce a respective trip signal of a set of trip signals in response to a respective event indication signal of the set of event indication signals; and
a logic circuit coupled to the set of glitch filters to receive the set of trip signals, wherein the logic circuit includes an input to receive a mask and is configured to:
mask off a first subset of the set of trip signals based on the mask; and
provide a trip output signal configured to inactivate the operation of the motor in response to a second subset of the set of trip signals that does not include the first subset.

20. The device of claim 19, wherein the set of event indication signals includes at least one of: a processor event signal, a short-circuit event signal, an overcurrent event signal, or a positional error event signal.

* * * * *